US009508893B2

(12) United States Patent
Cha et al.

(10) Patent No.: US 9,508,893 B2
(45) Date of Patent: Nov. 29, 2016

(54) METHOD FOR MANUFACTURING NANO-STRUCTURED SEMICONDUCTOR LIGHT-EMITTING ELEMENT

(71) Applicant: SAMSUNG ELECTRONICS CO., LTD., Suwon-si (KR)

(72) Inventors: Nam-Goo Cha, Ansan-si (KR); Dong-Ho Kim, Guri-si (KR); Geon-Wook Yoo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/764,484

(22) PCT Filed: Jan. 28, 2014

(86) PCT No.: PCT/KR2014/000810
§ 371 (c)(1),
(2) Date: Jul. 29, 2015

(87) PCT Pub. No.: WO2014/119909
PCT Pub. Date: Aug. 7, 2014

(65) Prior Publication Data
US 2015/0364642 A1 Dec. 17, 2015

(30) Foreign Application Priority Data

Jan. 29, 2013 (KR) .................. 10-2013-0010112
Nov. 29, 2013 (KR) .................. 10-2013-0147783

(51) Int. Cl.
*H01L 33/00* (2010.01)
*H01L 33/44* (2010.01)
(Continued)

(52) U.S. Cl.
CPC ......... *H01L 33/0075* (2013.01); *H01L 33/005* (2013.01); *H01L 33/007* (2013.01);
(Continued)

(58) Field of Classification Search
CPC ....... H01L 33/00; H01L 33/06; H01L 33/58; H01L 33/08; H01L 33/0075; H01L 33/0095; H01L 33/24; H01L 33/36; H01L 33/44; H01L 2933/0016; H01L 2933/0025
USPC ....................................... 438/35, 34
See application file for complete search history.

(56) References Cited

U.S. PATENT DOCUMENTS 6,372,608 B1  4/2002 Shimoda et al.
6,645,830 B2  11/2003 Shimoda et al.
(Continued)

FOREIGN PATENT DOCUMENTS

JP  2012-40878 A   3/2012
KR  10-0470904 B1  3/2005
(Continued)

OTHER PUBLICATIONS

Final Office Action issued on Nov. 9, 2015 issued by the United States Patent and Trademark Office in U.S. Appl. No. 14/165,168.
(Continued)

*Primary Examiner* — Chuong A Luu
(74) *Attorney, Agent, or Firm* — Sughrue Mion, PLLC

(57) ABSTRACT

There is provided a method for manufacturing a nanostructure semiconductor light emitting device, including: forming a mask having a plurality of openings on a base layer; growing a first conductivity-type semiconductor layer on exposed regions of the base layer such that the plurality of openings are filled, to form a plurality of nanocores; partially removing the mask such that side surfaces of the plurality of nanocores are exposed; heat-treating the plurality of nanocores after partially removing the mask; sequentially growing an active layer and a second conductivity-type semiconductor layer on surfaces of the plurality of nanocores to form a plurality of light emitting nanostructures, after the heat treatment; and planarizing upper parts of the plurality of light emitting nanostructures such that upper surfaces of the nanocores are exposed.

15 Claims, 19 Drawing Sheets

(51) Int. Cl.
  *H01L 33/08* (2010.01)
  *H01L 33/18* (2010.01)
  *H01L 33/24* (2010.01)
  *H01L 33/36* (2010.01)
  *H01L 33/06* (2010.01)
  *H01L 33/38* (2010.01)

(52) U.S. Cl.
  CPC .............. *H01L 33/08* (2013.01); *H01L 33/18* (2013.01); *H01L 33/24* (2013.01); *H01L 33/36* (2013.01); *H01L 33/0095* (2013.01); *H01L 33/06* (2013.01); *H01L 33/382* (2013.01); *H01L 33/387* (2013.01); *H01L 33/44* (2013.01); *H01L 2933/0016* (2013.01); *H01L 2933/0025* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,427,772 B2 | 9/2008 | Chuo et al. |
| 7,501,656 B2 | 3/2009 | Han et al. |
| 7,511,308 B2 | 3/2009 | Kim et al. |
| 7,588,955 B2 | 9/2009 | Huang et al. |
| 7,709,857 B2 | 5/2010 | Kim et al. |
| 7,759,140 B2 | 7/2010 | Lee et al. |
| 7,763,881 B2 | 7/2010 | Lee et al. |
| 7,781,727 B2 | 8/2010 | Sherrer et al. |
| 7,790,482 B2 | 9/2010 | Han et al. |
| 7,888,694 B2 | 2/2011 | Lee et al. |
| 7,906,787 B2 | 3/2011 | Kang |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,097,879 B2 | 1/2012 | Hu et al. |
| 8,129,711 B2 | 3/2012 | Kang et al. |
| 8,179,938 B2 | 5/2012 | Kim |
| 8,212,266 B2 | 7/2012 | Lee et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0037365 A1 | 2/2007 | Ranganath et al. |
| 2008/0246076 A1 | 10/2008 | Chen |
| 2010/0075114 A1 | 3/2010 | Kurihara et al. |
| 2012/0001153 A1 | 1/2012 | Hersee et al. |
| 2012/0061641 A1 | 3/2012 | Seong et al. |
| 2012/0129283 A1 | 5/2012 | Pan et al. |
| 2012/0129290 A1 | 5/2012 | Lin |
| 2012/0132888 A1 | 5/2012 | Kwak et al. |
| 2012/0235117 A1* | 9/2012 | Fukui ................ H01L 21/02488 257/13 |
| 2013/0099199 A1 | 4/2013 | Cha et al. |
| 2013/0112944 A1 | 5/2013 | Cha et al. |
| 2013/0153860 A1 | 6/2013 | Kim et al. |
| 2014/0166974 A1 | 6/2014 | Yoo et al. |
| 2014/0246647 A1 | 9/2014 | Cha et al. |
| 2014/0363912 A1 | 12/2014 | Ohlsson et al. |

FOREIGN PATENT DOCUMENTS

| | | |
|---|---|---|
| KR | 10-0661960 B1 | 12/2006 |
| KR | 10-2012-0028104 A | 3/2012 |
| KR | 10-2012-0058137 A | 6/2012 |
| KR | 10-2013-0025716 A | 3/2013 |
| KR | 10-2013-0040518 A | 4/2013 |
| KR | 10-2013-0051240 A | 5/2013 |
| KR | 10-1258583 B1 | 5/2013 |
| KR | 10-2014-0096970 A | 8/2014 |

OTHER PUBLICATIONS

Non-Final Office Action issued on May 19, 2015 issued by the United States Patent and Trademark Office in U.S. Appl. No. 14/165,168.

Int. Search Report dated May 13, 2014 issued in Int. Application No. PCT/KR2014/000810 (PCT/ISA/210).

Shunfeng Lia et al., "GaN based nanorods for solid state lighting", Journal of Applied Physics, Apr. 2, 2012, 24 pgs. Total 111, 071101-1 to -23.

Katsuhiro Tomioka et al., "GaAs/AlGaAs Core Multishell Nanowire-Based Light-Emitting Diodes on Si", Journal of Applied Physics, Apr. 8, 2010, 6 pgs. total (pp. 1693-1644.

* cited by examiner

METHOD FOR MANUFACTURING NANO-STRUCTURED SEMICONDUCTOR LIGHT-EMITTING ELEMENT

TECHNICAL FIELD

The present inventive concept relates to a method for manufacturing a nanostructure semiconductor light emitting device.

BACKGROUND ART

A semiconductor light emitting device such as a light emitting diode (LED), a device including materials emitting light, may convert energy generated through the recombination of electrons and electron holes in a junction semiconductor into light to be emitted therefrom. Light emitting diodes are widely used in lighting devices and display devices and as light sources, and the development thereof has therefore been accelerated.

DISCLOSURE

Technical Problem

An aspect of the present inventive concept provides a method for manufacturing a nanostructure semiconductor light emitting device having stable luminous efficiency by utilizing advantages provided by nanostructures.

Technical Solution

According to an aspect of the present inventive concept, there is provided a method for manufacturing a nanostructure semiconductor light emitting device including: forming a mask having a plurality of openings on a base layer; growing a first conductivity-type semiconductor layer on exposed regions of the base layer such that the plurality of openings are filled, to form a plurality of nanocores; partially removing the mask such that side surfaces of the plurality of nanocores are exposed; heat-treating the plurality of nanocores after partially removing the mask; sequentially growing an active layer and a second conductivity-type semiconductor layer on surfaces of the plurality of nanocores to form a plurality of light emitting nanostructures, after the heat treatment; and planarizing upper parts of the plurality of light emitting nanostructures such that upper surfaces of the nanocores are exposed.

The heat treatment may be performed in a temperature range from 600° C. to 1200° C.

The plurality of nanocores may have a substantially cylindrical shape before the heat treatment, and the plurality of nanocores may have a substantially hexagonal prism shape after the heat treatment.

The forming of the plurality of nanocores may include a crystal stabilization operation of performing a heat treatment after temporarily halting growth of the first conductivity-type semiconductor layer during growth of the first conductivity-type semiconductor layer.

The method may further include: forming contact electrodes on surfaces of the plurality of light emitting nanostructures, before the planarization process. Here, the method may further include: forming an insulating layer to fill spaces between the plurality of light emitting nanostructures, after the forming of the contact electrode.

The method may further include: partially removing the contact electrode such that the contact electrode has a height lower than upper surfaces of the light emitting nanostructures.

Side surfaces of the plurality of nanocores may have crystal planes perpendicular to an upper surface of the base layer. Here, the plurality of light emitting nanostructures and the base layer may be a nitride single crystal, and the side surfaces of the plurality of nanocores may be non-polar surfaces (m planes).

The mask may include a first material layer positioned on the base layer and a second material layer positioned on the first material layer and having an etching rate greater than that of the first material layer, and partially removing the mask may include removing the second material layer such that only the first material layer remains.

The plurality of openings may be classified as belonging to two or more groups different from each other in terms of at least one of a diameter of the plurality of openings and an interval between the plurality of openings, openings of the different groups may have substantially the same diameter and interval therebetween, light emitting nanostructures positioned in openings of the different groups may emit light having different wavelengths, and light emitting nanostructures positioned in openings of the same group may emit light having substantially the same wavelength.

Light of different wavelengths emitted from light emitting nanostructures positioned in the openings of the different groups may be combined to form white light.

According to an aspect of the present inventive concept, there is also provided a method for manufacturing a nanostructure semiconductor light emitting device including: forming a mask having a plurality of openings on a base layer; growing a first conductivity-type semiconductor layer on exposed regions of the base layer such that the plurality of openings are filled, to form a plurality of nanocores; sequentially growing an active layer and a second conductivity-type semiconductor layer on surfaces of the plurality of nanocores to form a plurality of light emitting nanostructures; forming contact electrodes on surfaces of the plurality of light emitting nanostructures; planarizing upper parts of the plurality of light emitting nanostructures such that upper surfaces of the nanocores are exposed; and partially removing the contact electrode such that the contact electrode has a height lower than upper surfaces of the plurality of light emitting nanostructures.

The method may further include: forming an insulating layer to fill spaces between the plurality of light emitting nanostructures, between the forming of the contact electrode and the planarizing.

The mask may include a first material layer positioned on the base layer and a second material layer positioned on the first material layer and having an etching rate greater than that of the first material layer, and the method may further include: removing the second material layer to expose side surfaces of the plurality of nanocores such that only the first material layer remains, before the forming of the plurality of light emitting nanostructures.

Effect of Invention

Even in the case of using a 3D nanostructure, an active layer may be provided on the same crystal planes, such that excellent luminescence properties may be obtained.

In addition, even in a case in which a growth height of a nanostructure is different due to a difference in growth speeds according to diameter (or width) or a distribution of the 3D nanostructure during a growth process of a 3D crystal structure, a planarization process may be applied, the nanostructure having a uniform height may be formed, providing advantages to manufacturing a light emitting device. In particular, such a process may be usefully used in differentiating cross-sectional areas (or diameters) of nanostructures and/or an interval therebetween in order to implement multiple wavelengths of light, for example, white light.

The above and other aspects, features and other advantages will be more clearly understood from the following detailed description taken in conjunction with specific embodiments

DETAILED DESCRIPTION OF THE EMBODIMENTS

Figure 1:
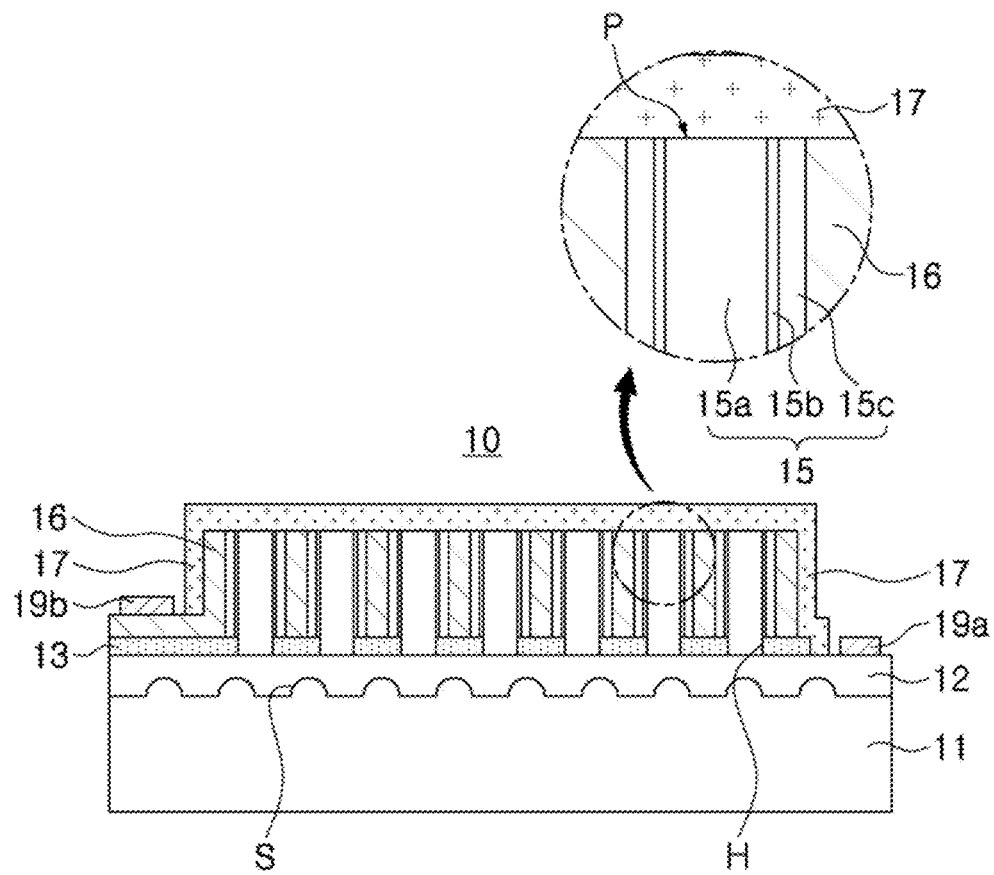
FIG. 1 is a cross-sectional view of a nanostructure semiconductor light emitting device according to an embodiment of the present inventive concept.

Hereinafter, embodiments will be described in detail with reference to the accompanying drawings.

The embodiment may, however, be embodied in many different forms and should not be construed as being limited to the embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIG. 1 is a cross-sectional view of a nanostructure semiconductor light emitting device according to an embodiment of the present inventive concept.

As illustrated in FIG. 1, a nanostructure semiconductor light emitting device 10 according to the present embodiment may include a base layer 12 formed of a first conductivity-type semiconductor material and a plurality of light emitting nanostructures 15 formed on the base layer 12.

The base layer 12 may be formed on a substrate 11, may provide a growth surface for the light emitting nanostructures 15, and may be electrically connected to the plurality of light emitting nanostructures 15.

The substrate 11 may be an insulating substrate, a conductive substrate or a semiconductor substrate. For example, the substrate 11 may be formed of sapphire, SiC, Si, $MgAl_2O_4$, MgO, $LiAlO_2$, $LiGaO_2$, or GaN.

The substrate 11 may have an upper surface on which an irregular pattern S having a hemispherical (convex?) shape is formed. A shape of the irregular pattern S may not be limited to the hemispherical shape and may be variously modified. For example, the irregular pattern S may have a cross-section having a triangular shape, a quadrangular shape, or a trapezoidal shape. By introducing the irregular pattern S, light extraction efficiency may be improved and defect density may be reduced. In consideration of such an effect, factors such as a shape of the cross-section, a size and/or distribution of the irregular pattern S may be variously selected.

The base layer 12 may be a nitride semiconductor satisfying $Al_xIn_yGa_{1-x-y}N$, where $0 \leq x < 1$, $0 \leq y < 1$, and $0 \leq x+y < 1$, and in particular, the base layer 12 may be doped with an n-type impurity such as silicon (Si) to have a specific conductivity type. For example, a thickness of the base layer 12 provided for the growth of the nanocores 15a may be equal to or greater than 1 μm. In consideration of a follow-up electrode formation process, or the like, the thickness of the base layer 12 may range from 3 μm to 10 μm. The base layer 12 may include GaN having an n-type impurity concentration of $\times 10^{18}/cm^3$ or greater. Before the formation of the base layer 12, a buffer layer may be additionally formed. In a specific example, the substrate 11 may be a silicon substrate, and in this case, $Al_yGa_{(1-y)}N$, where $0 \leq y < 1$, may be used as a material of the buffer layer. For example, the buffer layer may have a structure in which two or more layers having different compositions are repeatedly stacked a plurality of times. The buffer layer may have a grading structure in which a composition of aluminum (Al) is gradually decreased or increased.

An insulating layer 13 having openings H may be disposed on the base layer 12, and the openings H may be provided for growth of the light emitting nanostructures 15. The base layer 12 may be partially exposed through the openings H and nanocores 15a may be formed on the exposed regions of the base layer 12. The insulating layer may be used as a mask for growth of the nanocores 15a. For example, the insulating layer 13 may be formed of an insulating material that may be used in a semiconductor formation process, such as $SiO_2$ or $SiN_x$.

The light emitting nanostructures 15 may include the nanocores 15a formed of a first conductivity-type semiconductor and an active layer 15b and a second conductivity-type semiconductor layer 15c sequentially formed on surfaces of the nanocores 15a.

The active layer 15b may have a multi-quantum well (MQW) structure in which quantum well and quantum barrier layers are alternately stacked. For example, in the case that the active layer 15b is be formed of a nitride semiconductor, a GaN/InGaN structure may be used, but a single quantum well (SQW) structure may also be used. The second conductivity-type semiconductor layer 15c may be a crystal satisfying p-type $Al_xIn_yGa_{1-x-y}N$, where $0 \leq x < 1$, $0 \leq y < 1$, and $0 \leq x+y < 1$. The second conductivity-type semiconductor layer 15c may include an electron blocking layer (not shown) in a portion thereof adjacent to the active layer 15b. The electron blocking layer (not shown) may have a multilayer structure in which a plurality of layers having different compositions of $Al_xIn_yGa_{1-x-y}N$, where $0 \leq x < 1$, $0 \leq y < 1$, and $0 \leq x+y < 1$, are stacked, or may include at least one layer composed of $Al_yGa_{(1-y)}N$, where $0 \leq y < 1$. The electron blocking layer (not shown) may have a greater band gap than that of the active layer 15b to prevent electrons from flowing into the second conductivity type (p-type) semiconductor layer 15c.

As illustrated in FIG. 1, upper surfaces of the nanocores 15a may be provided as portions of upper surfaces (P) of the light emitting nanostructures 15, and the upper surfaces (P) of the light emitting nanostructures 15 may have planar surfaces (e.g., on a c plane) through a polishing process as necessary.

In the structure, the active layer 15b may only be present on side surfaces of the nanocore 15a and may not be present on the upper surface of the nanocore 15a. Since the nanocore 15a may be formed of a first conductivity-type semiconductor as described above and the side surfaces thereof may be the same crystal planes, the active layer 15b may be formed on the same crystal planes. Thus, a defect in which luminescence properties of the active layer 15b are changed depending on a crystal plane may be solved.

A shape of a nanocore (before being planarized) that may be employed in this embodiment will be described in more detail with reference to FIGS. 2 and 3.

Figure 2:
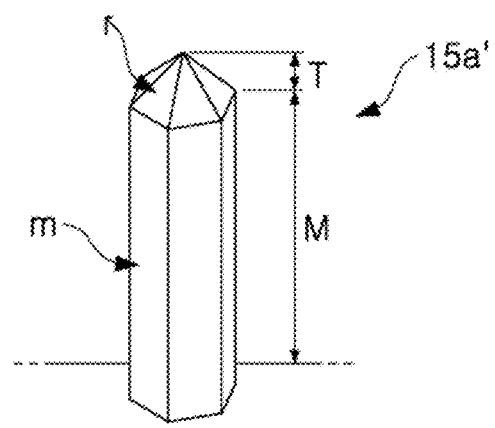
FIGS. 2 and 3 are views respectively illustrating examples of a nanocore employed in the embodiment of the present inventive concept.

As illustrated in FIG. 2, a nanocore 15a' may include a main part M providing side surfaces having first crystal planes in a growth direction and an upper part T providing a surface having second crystal planes different from the first crystal planes.

In a case in which the nanocore 15a' has a crystal structure having a hexagonal system such as a nitride single crystal, the first crystal planes may be non-polar surfaces (m-planes) and the second crystal planes may be a plurality of semipolar surfaces (r-planes). The nanocore 15a' may be understood as having a rod structure in which the upper part T has a hexagonal pyramidal shape.

Even in the case that an active layer is grown on the surface of the nanocore 15a' using the same process, compositions of the active layer (in particular, the content of indium when an InGaN layer is grown) are varied due to the difference between the characteristics of the crystal planes, and a wavelength of light generated by the active layer portion grown on the upper part (r planes) of the nanocore 15a' and a wavelength of light generated by the side surfaces (m planes) of the nanocore 15a' may be different. As a result, a half-width of the wavelength of emitted light may be increased, making it difficult to accurately implement light having a desired wavelength. Also, since semiconductor layers (active layer and second conductivity-type semiconductor layer) are grown to be relatively thin in the upper part having the semipolar surfaces, a leakage current may be concentrated.

In order to solve this problem, as illustrated in FIG. 1, the active layer and the second conductivity-type semiconductor layer portions positioned on the upper part of the nanocores 15a' may be removed to reduce a leakage current, and as a result, luminous efficiency may be enhanced. Also, and since the active layer portion positioned on the upper part of the nanocores 15a' is not involved in light emissions, a wavelength of emitted light may be accurately designed.

Besides the nanocore 15a' illustrated in FIG. 2, the aforementioned scheme may also be advantageously applied to any nanocore having various crystal structures and shapes in which an upper part thereof has a different crystal plane from that of side surfaces thereof. For example, as illustrated in FIG. 3, even when the upper parts of the nanocores do not have non-polar surfaces, the aforementioned scheme may be similarly applied.

Figure 3:
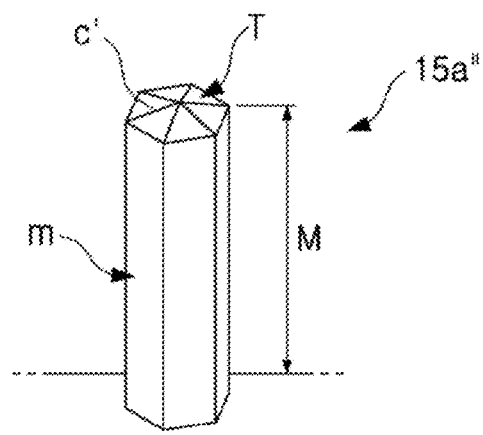

As illustrated in FIG. 3, similar to the case of FIG. 2, a nanocore 15a" has a main part M providing side surfaces having a first crystal planes (m planes), while the upper part T has crystal planes c' different from the first crystal planes (m planes), but the crystal planes are not completely non-polar surfaces.

Even in this configuration, an active layer may have different compositions and semiconductor growth layers have different thicknesses due to the differences in the characteristics of the crystal planes, leading to different wavelengths in emitted light and causing leakage currents. As described above with reference to FIG. 1, an active layer and second conductivity-type semiconductor regions positioned on the upper part T of the nanocore 15a" may be removed. As a result, a problem caused due to the generation of a leakage current and a difference in wavelengths of emitted light may be addressed to provide a highly efficient nanostructure semiconductor light emitting device.

In this manner, as illustrated in FIG. 1, since the side surfaces of the nanocore 15a may provide the same crystal planes and the active layer 15b may be formed only on the side surfaces of the nanocore 15a, the occurrence of a difference in luminescence properties due to a difference in crystal planes may be prevented.

The nanostructure semiconductor light emitting device 10 according to the embodiment may include a contact electrode 16 formed in spaces between light emitting nanostructures. The contact electrode 16 may be obtained by forming a seed layer (not shown) on a surface of the light emitting nanostructures 15 and subsequently performing electroplating thereon. The seed layer (not shown) may be formed of an appropriate material forming ohmic-contact with the second conductivity-type semiconductor layer 15c.

The material for ohmic-contact may include at least one of ZnO, a graphene layer, Ag, Ni, Al, Rh, Pd, Ir, Ru, Mg, Zn, Pt, and Au, and the seed layer may be a single layer or a plurality of layers. For example, after Ag/Ni/Cr layers are formed as a seed layer, Cu/Ni may be electroplated to form the desired contact electrode 16.

The contact electrode layer 16 used in the present embodiment may be a reflective metal layer to direct light in a direction toward the substrate, but the present inventive concept is not limited thereto and the contact electrode layer 16 may be formed of a transparent electrode material such as indium tin oxide (ITO) to extract light in a direction toward the light emitting nanostructures 15.

As illustrated in FIG. 1, the contact electrode layer 16 may have an upper surface substantially coplanar with the upper surfaces P of the light emitting nanostructures 15, but, in another example, the contact electrode layer 16 may have a surface lower than the upper surfaces P of the light emitting nanostructures 15. This will be described in more detail in a following embodiment.

A passivation layer 17 may be formed on the upper surfaces P of the light emitting nanostructures 15. The passivation layer 17 may prevent exposure and undesired electrical connections of the active layer 15*b*.

A portion of the base layer 12 formed of a first conductivity-type semiconductor may be exposed and a first electrode 19*a* may be formed on the exposed portion of the base layer 12. The contact electrode 16 formed between the light emitting nanostructures may be extended to a certain position above the base layer 12 and a second electrode 19*b* may be formed on the extension portion of the contact electrode 16.

In this manner, in the nanostructure semiconductor light emitting device of FIG. 1, since the side surfaces of the nanocore 15*a* have the same side surfaces (e.g., m planes) and the active layer 15*b* is formed on the side surfaces of the nanocore 15*a*, the active layer 15*b* may be formed on the same crystal planes. Such structure may be obtained by applying a planarization process such that the upper surfaces P of the light emitting nanostructures 15 are substantially coplanar with the upper surfaces of the nanocores 15*a*. The planarization process may be performed through a polishing process and/or an etching process.

In this manner, the method of providing the active layer on the same crystal planes of the nanocore in a limited manner may be performed using a planarization process. FIGS. 4 through 8 are cross-sectional views illustrating respective main processes in a method of manufacturing a nanostructure semiconductor light emitting device according to an embodiment of the present inventive concept.

Figure 4:
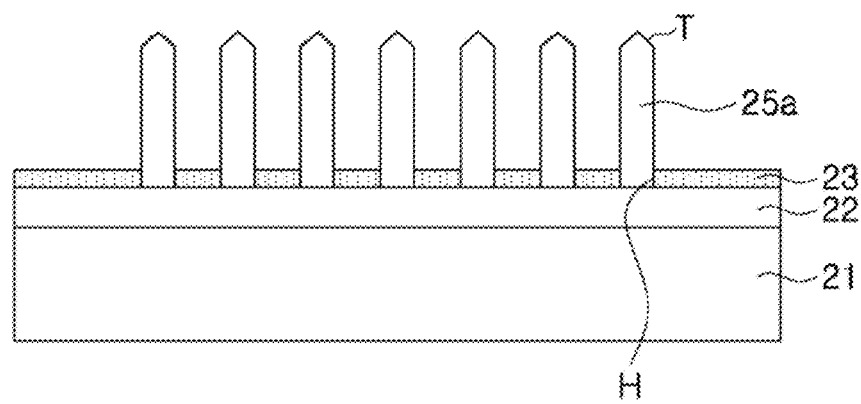
FIGS. 4 through 8 are cross-sectional views illustrating main processes in a method of manufacturing a nanostructure semiconductor light emitting device according to an embodiment of the present inventive concept.

As illustrated in FIG. 4, an insulating layer 23 may be formed as a mask on a base layer 22 formed of a first conductivity-type semiconductor and a plurality of nanocores 25*a* may be formed on exposed regions of the base layer 22.

The base layer 22 may be formed on a substrate 21 and electrically connected to the light emitting nanostructures 25, as well as providing a crystal growth surface for growing nanocores 25*a* thereon. Thus, the base layer 22 may be formed as a single-crystal semiconductor having electrical conductivity. In a case in which the base layer 22 is directly grown, the substrate 21 may be a crystal growth substrate.

The base layer 22 may be a nitride semiconductor satisfying $Al_xIn_yGa_{1-x-y}N$, where $0 \leq x < 1$, $0 \leq y < 1$, and $0 \leq x+y < 1$, and may be doped with n-type impurities such as silicon (Si). In this case, the substrate 21 may be formed of sapphire, SiC, Si, $MgAl_2O_4$, MgO, $LiAlO_2$, $LiGaO_2$, or GaN.

The insulating layer 23 may have a plurality of openings H through which regions of the base layer 22 may be exposed. The insulating layer 23 may expose the regions of the base layer 22 through the plurality of openings H being formed after depositing an insulating material on the base layer 22. The insulating layer 23 may be formed of an insulating material such as $SiO_2$ or SiN.

The openings H may have a size (width or diameter) designed in consideration of a desired size of the light emitting nanostructures. For example, the openings H may be formed to have a width (diameter) of 600 nm or less. Further, the openings H may be formed to have a width (diameter) ranging from 50 nm to 500 nm. Cross-sectional shapes and arrangements of the openings H may be variously formed and for example, the openings H may have various cross-sectional shapes, such as a polygonal shape, a quadrangular shape, an elliptical shape, a circular shape or the like.

The nanocores 25*a* may be obtained by selectively growing a first conductivity-type semiconductor using the insulating layer 23 as a mask. The first conductivity-type semiconductor of the nanocores 25*a* may be an n-type nitride semiconductor and for example, may be a crystal satisfying an n-type $Al_xIn_yGa_{1-x-y}N$, where $0 \leq x < 1$, $0 \leq y < 1$, and $0 \leq x+y < 1$. The first conductivity-type semiconductor configuring the nanocores 25*a* may be identical to the first conductivity-type semiconductor of the base layer 22. For example, the base layer 22 and the nanocores 25*a* may include an n-type GaN.

A nitride single crystal configuring the nanocores 25*a* may be formed using metal organic chemical vapor deposition (MOCVD) or molecular beam epitaxy (MBE). Since the crystal may be grown only on the regions of the base layer 22 exposed through the openings, rather than being formed on the insulating layer 23, desired nanocores 25*a* may be provided. The upper part T of the nanocore 25*a* may have crystal planes different from the side surfaces of the nanocore 25*a*. The present embodiment exemplifies the nanocore having a rod shape, but is not limited thereto. For example, the nanocore may have a polypyramidal shape such as a hexagonal pyramid shape or a conical shape. For example, the shape of the nanocore may be controlled by adjusting growth conditions such as a growth temperature, a growth pressure, and a flow amount of source gas.

Figure 5:
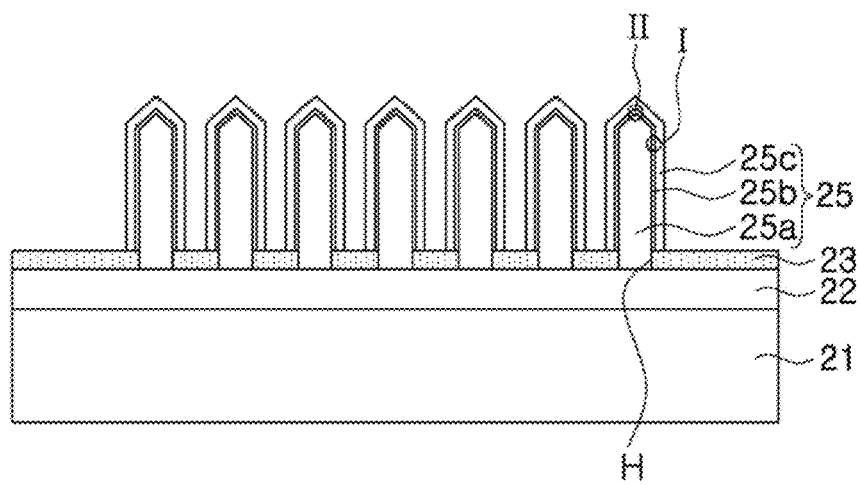

Next, as illustrated in FIG. 5, an active layer 25*b* and a second conductivity-type semiconductor layer 25*c* may be sequentially grown on surfaces of the plurality of nanocores 25*a*.

Through the process as described above, light emitting nanostructures 25 may have a core-shell structure in which the first conductivity-type semiconductor is provided as the nanocores 25*a*, and the active layer 25*b* and the second conductivity-type semiconductor layer 25*c* surrounding the respective nanocores 25*a* are provided as shell layers.

The active layer 25*b* may have a multiple quantum well (MQW) structure in which quantum well layers and quantum barrier layers are alternately stacked, for example, may have an GaN/InGaN structure in the case of a nitride semiconductor. Here, the active layer 25*b* may also have a single quantum well (SQW) structure.

The second conductivity-type semiconductor layer 25*c* may be a crystal satisfying p-type $Al_xIn_yGa_{1-x-y}N$, where $0 \leq x < 1$, $0 \leq y < 1$, and $0 \leq x+y < 1$. The second conductivity-type semiconductor layer 25*c* may include an electron blocking layer (not shown) in a portion thereof adjacent to the active layer 25*b*. The electron blocking layer (not shown) may have a multilayer structure in which a plurality of layers having different compositions of $Al_xIn_yGa_{1-x-y}N$, where $0 \leq x < 1$, $0 \leq y < 1$, and $0 \leq x+y < 1$, are stacked or may have at least one layer configured of $Al_yGa_{(1-y)}N$, where $0 \leq y < 1$. The electron blocking layer (not shown) may have a greater band gap than that of the active layer 25*b* to thus prevent electrons from flowing to the second conductivity-type (p-type) semiconductor layer 25*c*.

As illustrated in FIG. 5, each of the plurality of nanocores 25a may include a main part providing side surfaces having first crystal planes in a growth direction and an upper part providing an upper surface having a second crystal plane different from the first crystal planes.

When the base layer 22 is a nitride single crystal including an upper surface having a c-plane, the side surfaces of the main part may be crystal planes perpendicular to the growth surface of the base layer 22, that is, non-polar m-planes, and the upper surface of the upper part may have an r-plane perpendicular to the en-planes. In this manner, the surfaces of the nanocore 15a may have a plurality of different crystal planes.

Specifically, although the active layer 25b is grown through the same process, portion II of the active layer 25b grown on the surface (r-plane) of the upper part of the nanocore 25a may have the content of indium lower than that of a portion I of the active layer 25b grown on the side surfaces (m-planes) of the nanocore 25a. As a result, portion II of the active layer 25b grown on the surface (r-plane) of the upper part of the nanocore 25a may emit light having a wavelength longer than an intended wavelength range.

Also, the active layer portion II positioned in the upper part T of the nanocore 25a may be grown to be thinner than the active layer portion I positioned on the side surfaces (m-planes) of the nanocore 25 even under the same process conditions. Thus, a leakage current may be generated in the active layer portion II positioned in the upper part T of the nanocore 25a.

In order to alleviate the problem, in this embodiment, a process of removing the active layer portion II present on the other crystal plane may be emitted may be additionally undertaken. The processes as described above are illustrated in FIGS. 6 and 8.

Figure 6:
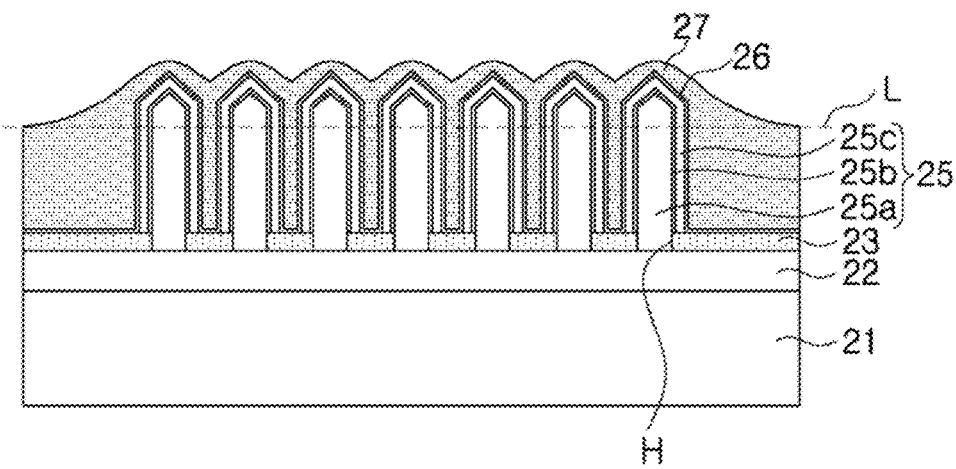

First, as illustrated in FIG. 6, a contact electrode 26 may be formed on the light emitting nanostructures 25. Additionally, an protective insulating layer 27 may be formed on the contact electrode 26. As illustrated in FIG. 6, the protective insulating layer 27 may be formed to fill spaces between the light emitting nanostructures 25.

The contact electrode 26 may be formed of a material forming ohmic-contact with the second conductivity-type semiconductor layer. For example, the contact electrode 26 may include at least one of Ag, Ni, Al, Rh, Pd, Ir, Ru, Mg, Zn, Pt, and Au, and may be provided as a monolayer or a plurality of layers.

The protective insulating layer 27 may be formed of an electrically insulating material able to provide a passivation structure through a semiconductor process. An protective insulating layer formed of $SiO_2$ or $SiN_x$ may be used as the protective insulating layer 27. In detail, the protective insulating layer 27 may be formed of tetraethylorthosilane (TEOS), borophosphor silicate glass (BPSG), CVD-$SiO_2$, spin-on glass (SOG), or a spin-on dielectric (SOD) material in order to easily fill the spaces between the light emitting nanostructures 25.

In this embodiment, it is illustrated that the contact electrode 26 is provided as a thin layer along the surface of the light emitting nanostructures 26 and the protective insulating layer 27 acting as a passivation layer fills the spaces between the light emitting nanostructures 25, but alternatively, like the structure illustrated in FIG. 1, the contact electrode may also be formed as a thick film to fill the spaces between the light emitting nanostructures 25.

In such an example, the contact layer 26 may be obtained by forming a seed layer able to form ohmic-contact on the surface of the light emitting nanostructures 25 and subsequently performing electroplating thereon. For example, after sputtering an Ag/Ni/Cr layer as a seed layer, the intended contact electrode 26 may be formed by electroplating Cu/Ni.

In this embodiment, the protective insulating layer may be used as a support for the light emitting nanostructures during a follow-up planarization process. Alternatively, in a case in which an electrode material is used as a support for the light emitting nanostructures 25 (please refer to the structure of FIG. 1), the filling electrode material may be used as a support during a follow-up planarization process.

Figure 7:
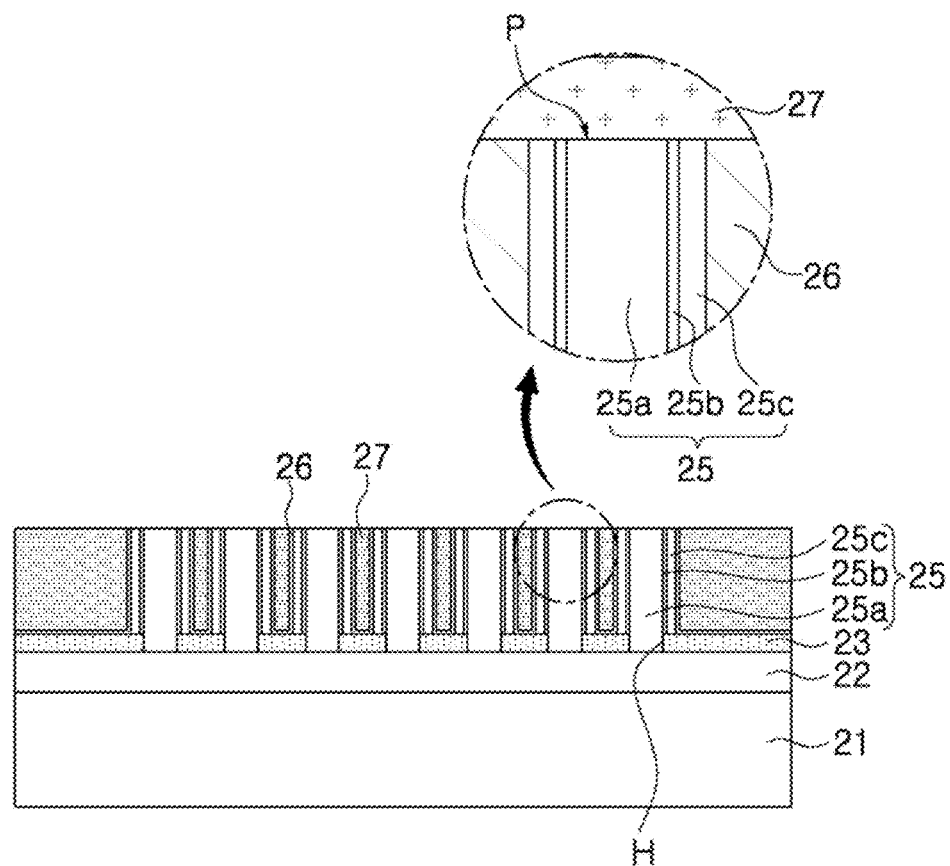

Subsequently, a process of performing planarizing to a level L so as to remove the portion of the active layer formed on the other crystal plane (upper surface) of the nanocore 25a may be performed. As a result, as illustrated in FIG. 7, the portion of the active layer positioned on the other crystal plane (upper surface) of the nanocore 25a may be removed, and the remaining portions of the active layer 25b may only be formed on the side surfaces of the nanocore 25a. Since the side surfaces of the nanocore 25a may be the same crystal planes P, desired wavelength characteristics may be appropriately realized. Also, a leakage current problem easily arising in the active layer portion positioned in the upper part of the nanocore 25a may be reduced.

In the nanocore 25a, since the side surfaces thereof may generally have a larger area than that of the upper surfaces thereof, effects due to a reduction in a light emitting area may not be significant. In particular, in the case of the nanocore 25a having a high aspect ratio, improvements in luminescence properties, rather than the effects due to a reduction in a light emitting area may be significant.

Figure 8:
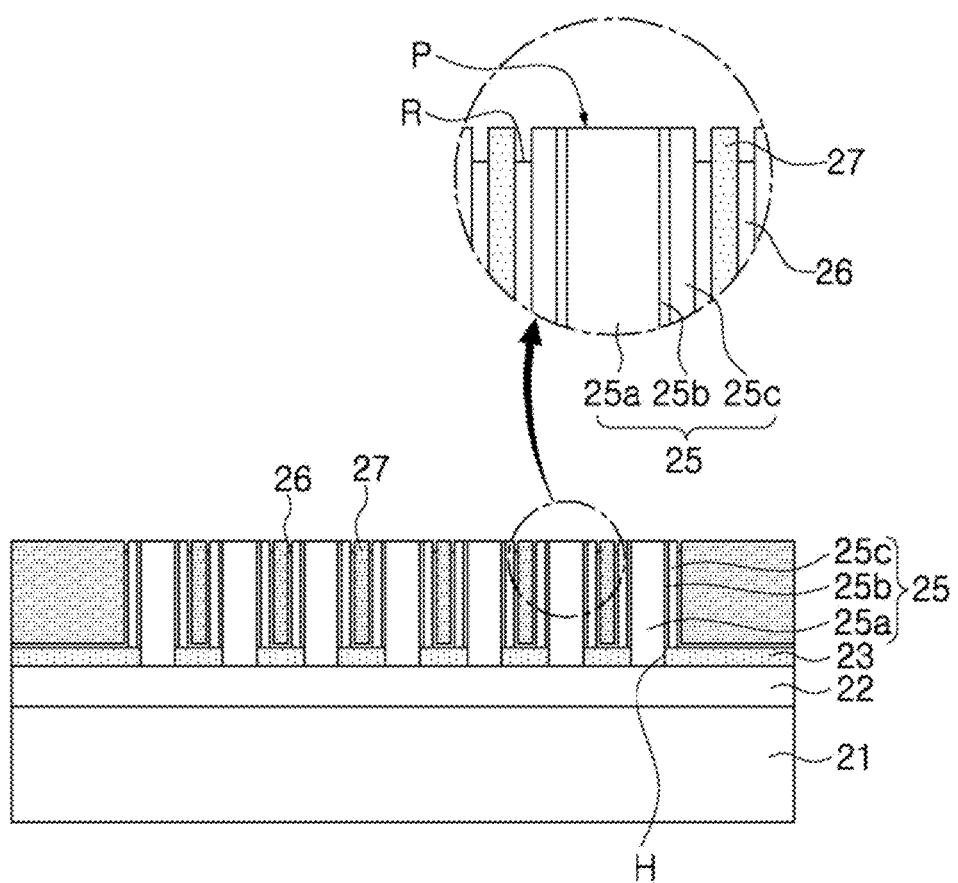

Thereafter, as illustrated in FIG. 8, an upper portion of the contact electrode 26 may be selectively etched.

During the etching process, the contact electrode 26 may have a recess R positioned to be lower than the planarized upper surfaces P of the light emitting nanostructures 25. Thus, a leakage current problem may arise due to a material of the contact electrode 26 that may remain on the planarized surface through the previous polishing process or due to the contact electrode 26 positioned in the upper part during a subsequent process. Such a leakage current problem due to the contact electrode may be reduced by the present etching process.

The present etching process may be performed as dry or wet etching process to selectively remove the contact electrode 26, and here, an appropriate etching process and an etchant may be selectively used depending on a material of the contact electrode 26. For example, in a case in which the contact electrode 26 is ITO and the light emitting nanostructures 25 are a nitride single crystal, a plasma etching process may be used, and here, $Cl_2$, $BCl_3$, Ar, or any combinations thereof may be used as a plasma gas. Also, selection (type or mixing ratio) of the etchant and process conditions may be adjusted.

In the nanostructure semiconductor light emitting device of FIG. 8, an electrode may be formed to have various structures. FIGS. 9 through 13 are cross-sectional views illustrating respective main processes in an example of an electrode formation process.

Figure 9:
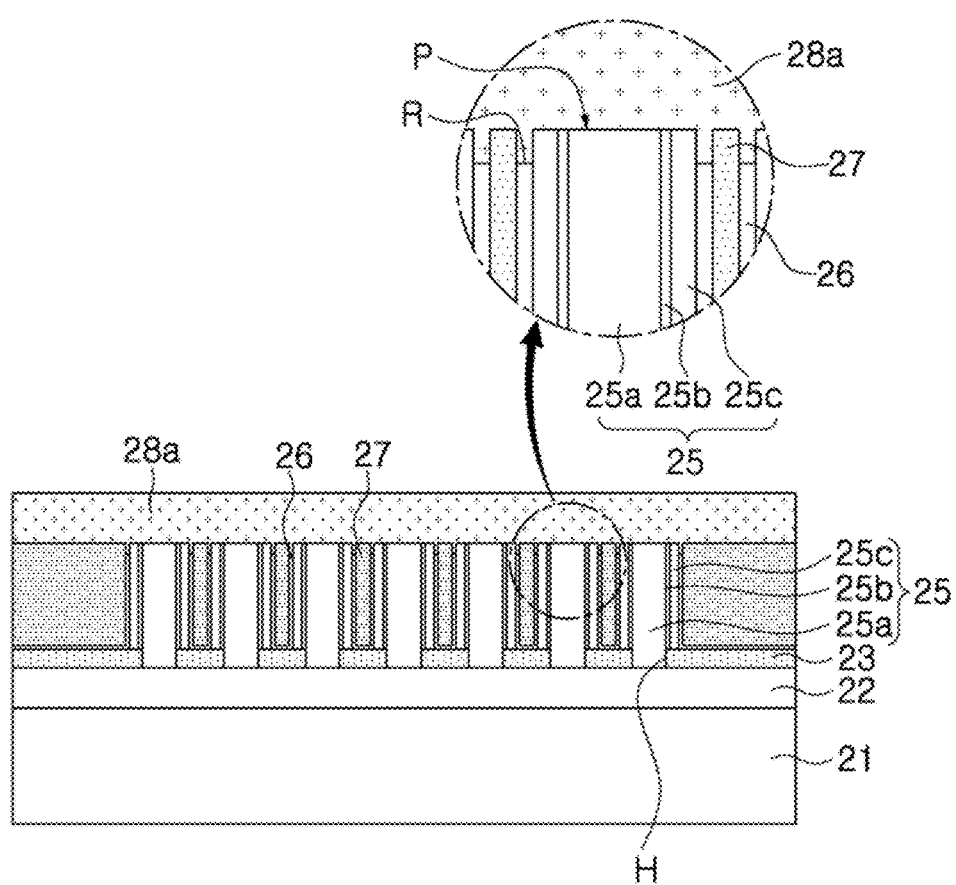
FIGS. 9 through 13 are cross-sectional views illustrating respective main processes in an electrode formation process for a resultant product of FIG. 8.

As illustrated in FIG. 9, a first passivation layer 28a is formed on the light emitting nanostructure 25.

The first passivation layer 28a may be formed to cover the planarized upper surfaces of the light emitting nanostructures 25 and the protective insulating layer 27. The first passivation layer 28a may be formed of a material the same as or similar to the material used for the protective insulating layer 27.

Figure 10:
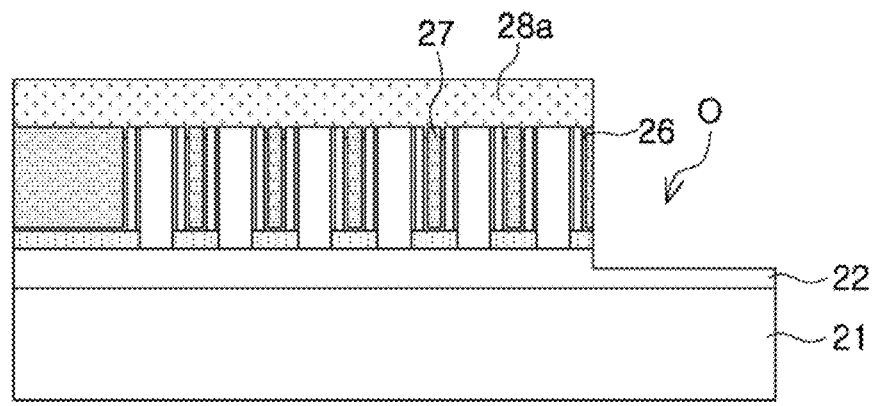

Subsequently, as illustrated in FIG. 10, the protective insulating layer 27 and the first passivation layer 28 may be selectively removed to expose a portion O of the base layer 22.

An exposed region e1 may provide a region in which a first electrode is to be formed. The present removing process may be performed using a photolithography process. In a specific example, a portion of the light emitting nanostructures 25 positioned in the desired exposed region e1 may be removed, but the nanocore 25a may not be grown in the region in which an electrode is to be formed, such that the light emitting nanostructure 25 removed during the present process is not present (please refer to FIG. 15).

Figure 11:
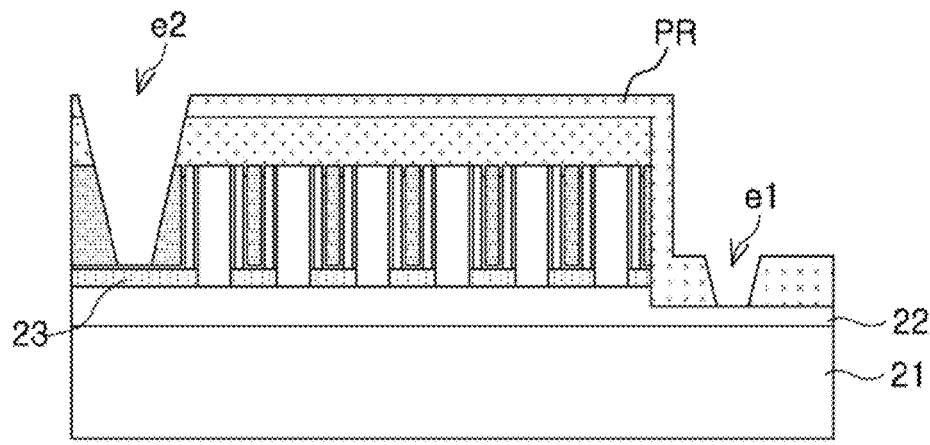

Thereafter, as illustrated in FIG. 11, photoresist PR having first and second openings e1 and e2 may be formed. The first and second openings e1 and e2 may define first and second electrode formation regions. During the present process, the first opening e1 may expose a portion of the base layer 23 and the second opening e2 may expose a portion of the contact electrode 26.

Figure 12:
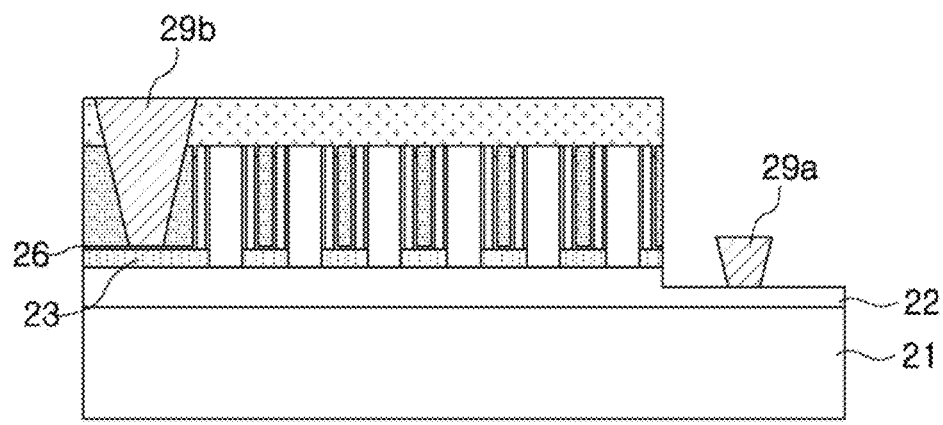

Thereafter, as shown in FIG. 12, first and second electrodes 29a and 29b are formed in the first and second openings, respectively. An electrode material used in the present process may be formed of a common electrode material of the first and second electrodes 29a and 29b. For example, a material for the first and second electrodes 29a and 29b may include Au, Ag, Al, Ti, W, Cu, Sn, Ni, Pt, Cr, ZnO, ITO, graphene, Sn, TiW, AuSn, or eutectic metals thereof.

Figure 13:
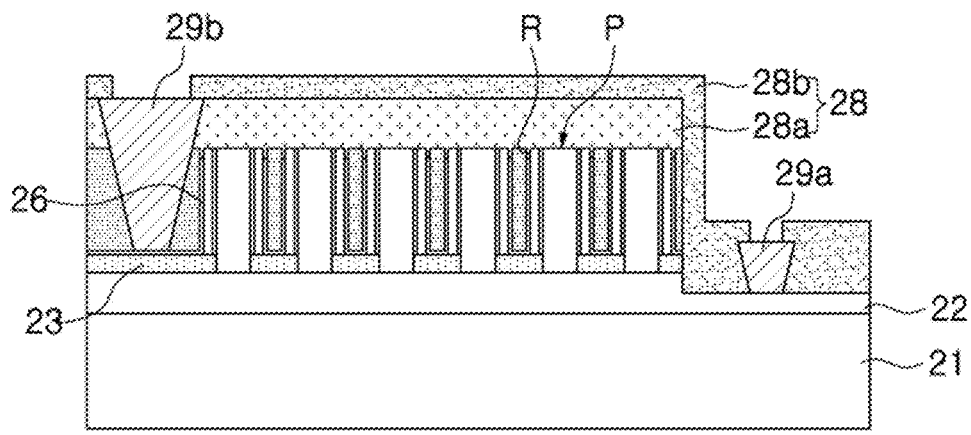

Subsequently, as illustrated in FIG. 13, an additional second passivation layer 28b may be formed. The second passivation layer 28b may provide a protective layer 28 together with the first passivation layer 28a. The second passivation layer 28b may firmly maintain the first and second electrodes 29a and 29b, as well as covering to protect the exposed semiconductor region.

The second passivation layer 28b may be formed of a material the same as or similar to that of the first passivation layer 28a.

The manufacturing method according to the embodiment of the present inventive concept may be variously modified. For example, a process of filling the nanocore using a mask as a mold structure to grow the nanocore may be advantageously used. FIGS. 14 through 22 are cross-sectional views illustrating respective main processes in a method of manufacturing a nanostructure semiconductor light emitting device according to another embodiment of the present inventive concept.

Figure 14:
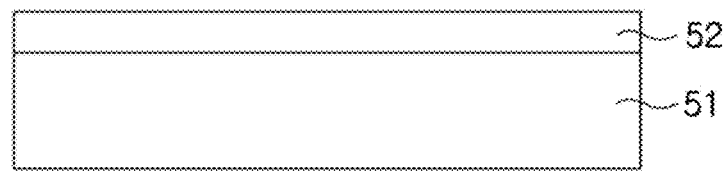
FIGS. 14 through 22 are cross-sectional views illustrating main processes in a method of manufacturing a nanostructure semiconductor light emitting device according to another embodiment of the present inventive concept.

As illustrated in FIG. 14, a base layer 52 may be provided by growing a first conductivity-type semiconductor on a substrate 51.

The base layer 52 may provide a crystal growth surface for growing light emitting nanostructures thereon and may be used to electrically connect light emitting nanostructures 55 to each other. Therefore, the base layer 52 may be formed of a single-crystal semiconductor having electrical conductivity. In a case in which the base layer 52 is directly grown, the substrate 51 may be a crystal growth substrate.

The base layer 52 may be a nitride semiconductor satisfying $Al_xIn_yGa_{1-x-y}N$ where $0 \leq x < 1$, $0 \leq y < 1$, $0 \leq x+y < 1$, and may be doped with n-type impurities such as silicon (Si). In this case, the substrate 51 may be formed of sapphire, SiC, Si, $MgAl_2O_4$, MgO, $LiAlO_2$, $LiGaO_2$, or GaN.

In a case in which the substrate is formed of silicon (Si), the substrate may be warped or broken due to a difference in coefficients of thermal expansion between Gan and silicon, or the occurrence of defects may be possibly increased due to a difference in lattice constants. Therefore, in this case, since defects need to be suppressed while providing stress control to suppress warping, a buffer layer having a composite structure may be used. The buffer layer may be a crystal not including gallium (Ga) to prevent a reaction between the silicon element of the silicon substrate and gallium (Ga). For example, the buffer layer may be formed of AlN or SiC. Also, in a case in which a plurality of AlN layers are used, an AlGaN intermediate layer may be inserted therebetween to control stress in the center of GaN.

The substrate 51 may be entirely or partially removed or patterned during a chip manufacturing process to enhance light emissions or electrical characteristics of an LED chip, before or after growing an LED structure.

For example, when the substrate 51 is a sapphire substrate, the substrate 51 may be separated using a laser lift off (LLO) process, and when the substrate 51 is formed of silicon or silicon carbide, the substrate 51 may be removed through a method such as polishing or etching.

In the case that the substrate 51 is removed, another support substrate may be used. In the support substrate, a reflective metal may be attached to or a reflective structure may be inserted between junction layers in order to improve light extraction efficiency of an LED chip.

When the substrate 51 is patterned, unevenness or an inclined surface may be formed on main surfaces or both side surfaces of the substrate before or after the growth of a single crystal to improve light extraction efficiency and crystalline properties. The size of a pattern may be selected from a range of 5 nm to 500 μm, and any pattern structure may be used as long as the pattern structure may increase light extraction efficiency using a regular or irregular pattern. The pattern may be variously formed, for example, may have a pillar shape, a peak-and-valley shape, a semispherical shape, or the like.

Figure 15:
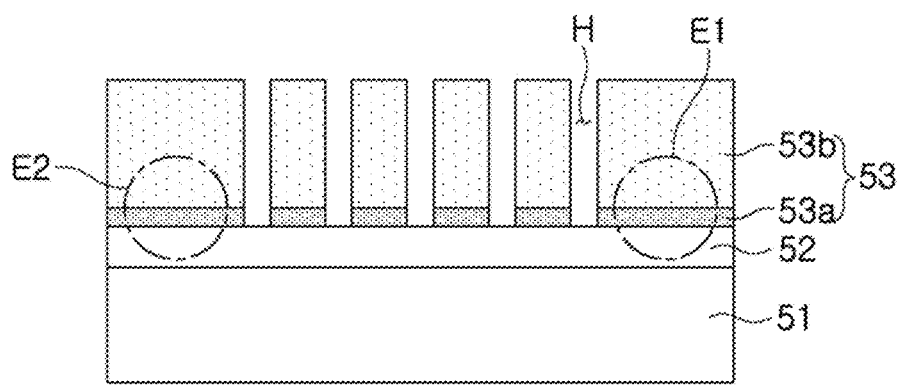

Next, as shown in FIG. 15, a mask 53 having a plurality of openings H and an etch-stop layer interposed therein may be formed on the base layer 52.

The mask 53 according to the present embodiment may include a first material layer 53a formed on the base layer 52, and a second material layer 53b formed on the first material layer 53a and having an etching rate greater than that of the first material layer 53a.

The first material layer 53a may be provided as the etch-stop layer. That is, the first material layer 53a may have an etching rate lower than that of the second material layer 53b under etching conditions of the second material layer 53b. At least the first material layer 53a may be formed of a material having electrical insulation properties, and the second material layer 53b may also be formed of an insulating material as needed.

The first and second material layers 53a and 53b may be formed of different materials to obtain a required difference in etching rates. For example, the first material layer 53a may be a SiN layer and the second material layer 53b may be a $SiO_2$ layer. Unlike this, the second material layer 53b or both of the first and second material layers 53a and 53b may be formed of a material having a porous structure to secure a difference in etching rates using a difference in porosity. In this case, the first and second material layers 53a and 53b may be formed of the same material.

The total thickness of the first and second material layers 53a and 53b may be designed in consideration of a desired height of a nanostructure. The first material layer 53a may have a thickness smaller than that of the second material layer 53b. An etch-stop level through the first material layer 53a may be a point at a depth equal to or less than ⅓ of the overall height of the mask 53, that is, the total thickness of the first and second material layers 53a and 53b, from the surface of the base layer 52. In other words, the thickness of the first material layer 53b may be equal to or less than ⅓ of the total thickness of the first and second material layers 53a and 53b.

The overall height of the mask 53, that is, the total thickness of the first and second material layers 53a and 53b may be 10 nm to 100 µm.

After the first and second material layers 53a and 53b are sequentially formed on the base layer 52, a plurality of openings H may be formed in the first and second material layers to expose regions of the base layer therethrough (FIG. 1B). The size of each opening H exposing the surface of the base layer 53 may be designed in consideration of a desired size of the light emitting nanostructure. For example, the opening H may have a width (diameter) of 600 nm or less, specifically, range from 50 to 500 nm.

The regions in which the openings H are formed are regions in which nanocores, i.e., light emitting nanostructures, are to be grown, and thus, regions E1 and E2 in which electrodes are to be formed may be set in advance and the openings H may not be formed in the regions E1 and E2. In this case, a process of removing light emitting nanostructures may not need to be performed in a follow-up electrode formation process.

The openings H of the mask 53 may be formed through a semiconductor process, for example, a deep-etching process, to have a relatively high aspect ratio. The openings H may be implemented to have an aspect ratio of 5:1 or higher, specifically, 10:1 or higher. While varied depending on etch conditions, in general, the openings H in the first and second material layers 53a and 53b may have a width decreased in a direction toward the base layer (please refer to experimental examples and FIG. 31 below).

In general, during the deep-etching process, and reactive ions generated from plasma or ion beams generated in high vacuum may be used. The deep-etching process is dry etching allowing for precision machining on a micro-structure without geometric constraints, compared to wet etching. A CF-based gas may be used for oxide film etching of the mask 53. For example, an etchant obtained by combining at least one of $O_2$ and Ar to a gas such as $CF_4$, $C_2F_6$, $C_3F_8$, $C_4F_8$, or $CHF_3$ may be used.

Cross-sectional shapes of the openings H and the alignment thereof may be variously implemented. For example, the opening H may have various cross-sectional shapes such as a polygonal shape, a quadrangular shape, an elliptical shape or a circular shape. Although the case in which the opening H shown in FIG. 15 has a rod shape is illustrated, the embodiment is not limited thereto. The opening H may be variously shaped using an appropriate etching process.

Figure 16:
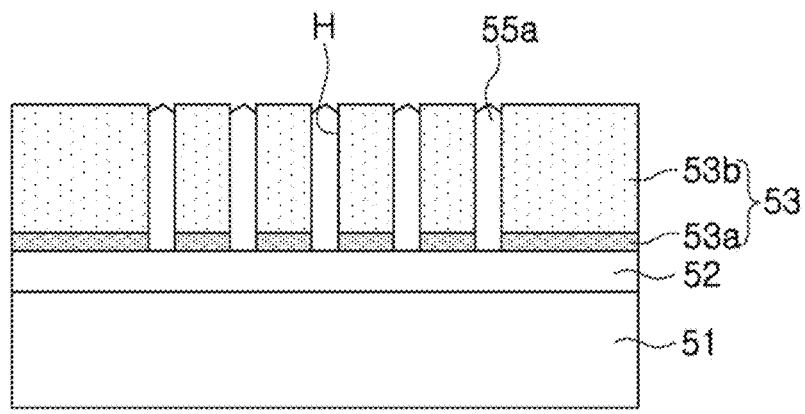

Next, as shown in FIG. 16, a first conductivity-type semiconductor is grown on the exposed regions of the base layer 52 such that the plurality of openings H are filled with the first conductivity-type semiconductor, thereby forming a plurality of nanocores 55a.

The first conductivity-type semiconductor of the nanocores 55a may be an n-type nitride semiconductor, for example, may be a crystal satisfying n-type $Al_xIn_yGa_{1-x-y}N$, where $0 \leq x<1$, $0 \leq y<1$, $0 \leq x+y<1$. The first conductivity-type semiconductor configuring the nanocores may be formed of the same material as the first conductivity-type semiconductor of the base layer 52. For example, the base layer 52 and the nanocores 55a may be formed of n-type GaN.

A nitride single crystal configuring the nanocores 55a may be formed using metal organic chemical vapor deposition (MOCVD) or molecular beam epitaxy (MBE). The mask 53 may serve as a mold for a grown nitride single crystal to provide the nanocores 55a having shapes corresponding to those of the openings. That is, the nitride single crystal may be selectively grown on regions of the base layer 52 exposed to the openings H by using the mask 53 to fill the openings H therewith. The nitride single crystal selectively grown on regions of the base layer 52 exposed to the openings H may have a form corresponding to those of the openings H.

Figure 17:
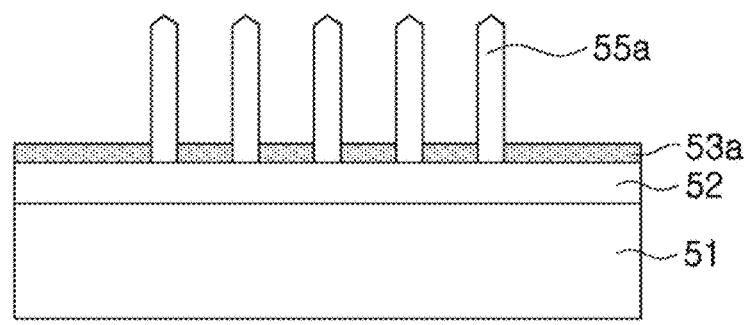

Next, as shown in FIG. 17, the mask 53 may be partially removed using the first material layer 53a as an etch-stop layer such that side surfaces of the plurality of nanocores 55a are exposed.

In the present embodiment, an etching process may be performed in such a manner that only the second material layer 53b may be selectively removed while the first material layer 53a remains. In the present etching process, the first material layer 53a may be used as the etch-stop layer, and in a subsequent process, the first material layer 53a may prevent an active layer 55b and a second conductivity-type semiconductor layer 55c from contacting the base layer 52.

Figure 18:
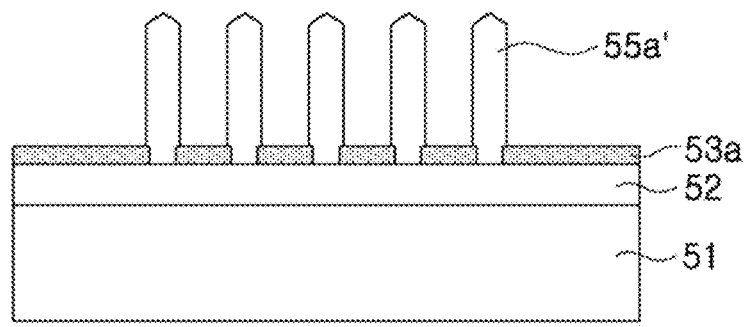

As in the present embodiment, in the process of manufacturing light emitting nanostructures by using a mask provided with openings as a mold, a heat treatment process may be further included to improve crystalline properties. FIG. 18 illustrates a nanocore 55' that has been heat-treated to have improved crystalline properties.

After removing the mask, a surface of the nanocore 55a may be subjected to a heat treatment in a predetermined condition such that a crystal plane of the nanocore 55a may be changed to a stable surface suitable for crystal growth, such as a semipolar or non-polar crystal plane. Such a process may be explained with reference to FIGS. 23 and 24.

Figure 23:
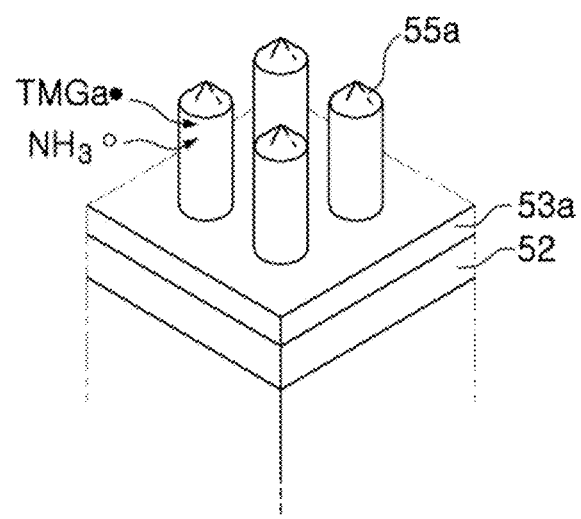
FIGS. 23 and 24 are mimetic diagrams respectively showing heat treatment processes applied to FIGS. 17 and 18.
Figure 24:
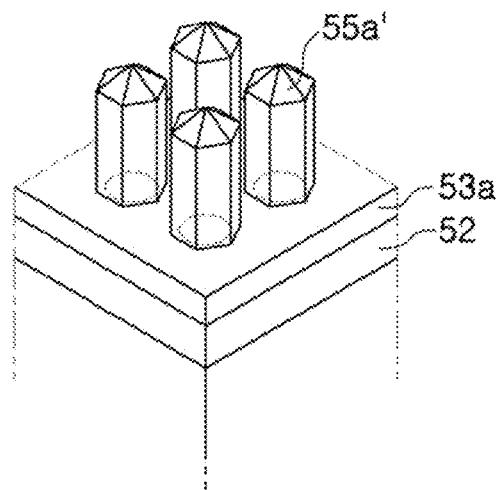

FIGS. 23 and 24 are mimetic diagrams respectively showing heat treatment processes applied to FIGS. 5D and 5E.

FIG. 23 may illustrate nanocores 55a obtained in the process of FIG. 17. Each of the nanocores may have crystal planes determined depending on a cross-sectional shape of an opening. Although the obtained nanocore 55a has crystal planes determined depending on a cross-sectional shape of the opening H, the crystal planes of the nanocore 55a provided as described above may be relatively unstable, which may be a factor deteriorating subsequent crystal growth conditions.

As in the present embodiment, in a case in which the opening has a cylindrical rod shape, a side surface of the nanocore 55a may have a curved surface rather than a specific crystal plane as illustrated in FIG. 23.

When this nanocore is subjected to a heat treatment, unstable crystals on the surface thereof may be re-aligned, such that a stable crystal plane such as in semipolarity or non-polarity may be formed as illustrated in FIG. 24. The heat treatment may be performed at a temperature of 600° C. or higher, or at a temperature ranging from 800° C. to 1200° C. in a specific example, for a few seconds to tens of minutes (1 second to 60 minutes), thereby converting an unstable crystal plane into a stable crystal plane.

In the heat treatment process, if the substrate temperature is lower than 600° C., it is difficult to grow and rearrange crystals of the nanocores, making it difficult to obtain a heat treatment effect, and if the substrate temperature is lower than 1200° C., nitrogen (N) is evaporated from the GaN crystal planes to degrade crystal quality. Also, for a period of time shorter than 1 second, it is difficult to obtain a sufficient heat treatment effect, and a heat treatment performed for tends of minutes, for example, for a period of time longer than 60 minutes, is not desirable in terms of a manufacturing process and manufacturing costs.

For example, when the nanocore 55 is grown using a C (0001) plane of the sapphire substrate ((111) plane in case of a silicon substrate), a nanocore 55a having a cylindrical shape illustrated in FIG. 23 may be heat-treated in an appropriate temperature range as mentioned above to convert a curved surface (side surface), an unstable crystal plane, into hexagonal crystal column (55a' in FIG. 24) having a non-polar surface (m plane) as a stable crystal plane. Stabilization of the crystal plane may be realized through the heat treatment process performed at a high temperature.

Although it is difficult to clearly explain such a principle, in a case in which crystals positioned on the surface at a relatively high temperature are re-aligned or a source gas remains in a chamber, it can be understand that partial re-growth is performed to have a stable crystal plane through deposition of the remaining source gas.

In particular, in view of re-growth, a heat treatment process may be performed in an atmosphere in which source gas remains in a chamber, or a heat treatment may be performed in a condition of intentionally supplying a relatively small amount of source gas. For example, as shown in FIG. 23, in the case of an MOCVD chamber, TMGa and NH$_3$ remain, and in this residual atmosphere, the heat treatment is performed such that source gas reacts with a nanocore surface to thus realize partial re-growth so as to have a stable crystal plane. Due to this regrowth, widths of the heat-treated nanocores 55a' may be slightly increased, relative to those of the nanocores 55a prior to the heat treatment process (please refer to FIGS. 23 and 24).

In this manner, crystallinity of the nanocores may be enhanced by introducing the additional heat treatment process. Namely, through the heat treatment process, non-uniformity (for example, a defect, or the like) present on the surfaces of nanocores after the removal of the mask may be removed and stability of the internal crystals may be greatly enhanced through rearrangement. The heat-treatment process may be performed under conditions similar to those of the growth process of the nanocores within a chamber after the removal of the mask. For example, the heat treatment process may be performed at a temperature (for example, a substrate temperature) ranging from 800° C. to 1200° C., but a similar effect may also be obtained even with a heat treatment process performed at a temperature equal to or higher than 600° C.

Figure 19:
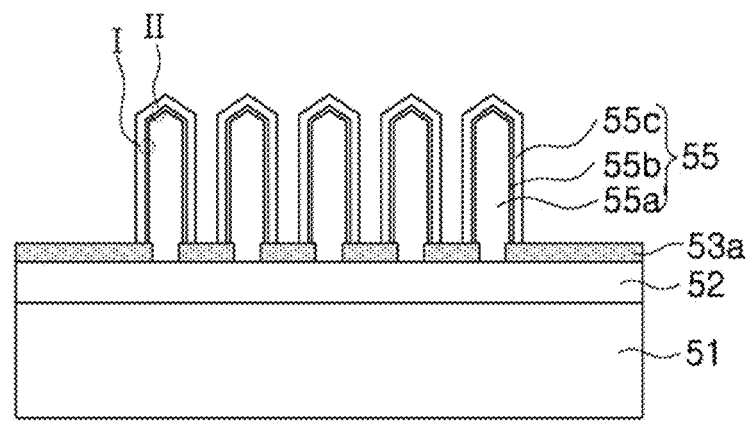

Next, as illustrated in FIG. 19, the active layer 55b and the second conductivity-type semiconductor layer 55c may be sequentially grown on surfaces of the plurality of nanocores 55a'.

Through the process as described above, light emitting nanostructures 55 may have a core-shell structure in which the first conductivity-type semiconductor is provided as the nanocores 55a', and the active layer 55b and the second conductivity-type semiconductor layer 55c surrounding the respective nanocores 55a' are provided as shell layers.

The active layer 55b may have a multiple quantum well (MQW) structure in which quantum well layers and quantum barrier layers are alternately stacked, for example, may have an GaN/InGaN or GaN/AlGaN structure in the case of a nitride semiconductor. Here, the active layer 55b may also have a single quantum well (SQW) structure.

The second conductivity-type semiconductor layer 55c may be a crystal satisfying p-type $Al_xIn_yGa_{1-x-y}N$, where $0 \le x < 1$, $0 \le y < 1$, and $0 \le x+y < 1$. The second conductivity-type semiconductor layer 55c may include an electron blocking layer (not shown) in a portion thereof adjacent to the active layer 55b. The electron blocking layer (not shown) may have a multilayer structure in which a plurality of layers having different compositions of $Al_xIn_yGa_{1-x-y}N$, where $0 \le x < 1$, $0 \le y < 1$, $0 \le x+y < 1$, are stacked or may have at least one layer configured of $Al_yGa_{(1-y)}N$, where $0 \le y < 1$. The electron blocking layer (not shown) may have a greater band gap than that of the active layer 55b to thus prevent electrons from flowing to the second conductivity-type (p-type) semiconductor layer 55c.

Each of the nanocores 55a' may include a main part providing a side surface having a first crystal plane in a growth direction and an upper part providing an upper surface having a second crystal plane different from the first crystal plane.

When the base layer 52 is a nitride single crystal including an upper surface having a c-plane, the side surface of the main part may have a crystal plane perpendicular to the growth surface of the base layer 52, that is, a non-polar m-plane, and the surface of the upper part may have a semipolar r-plane different from the cn-plane. In this manner, the surfaces of the nanocore 55a may have a plurality of different crystal planes.

Figure 21:
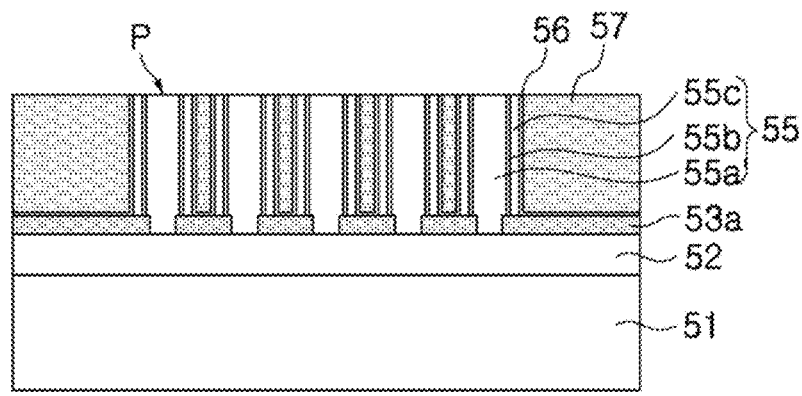
Figure 22:
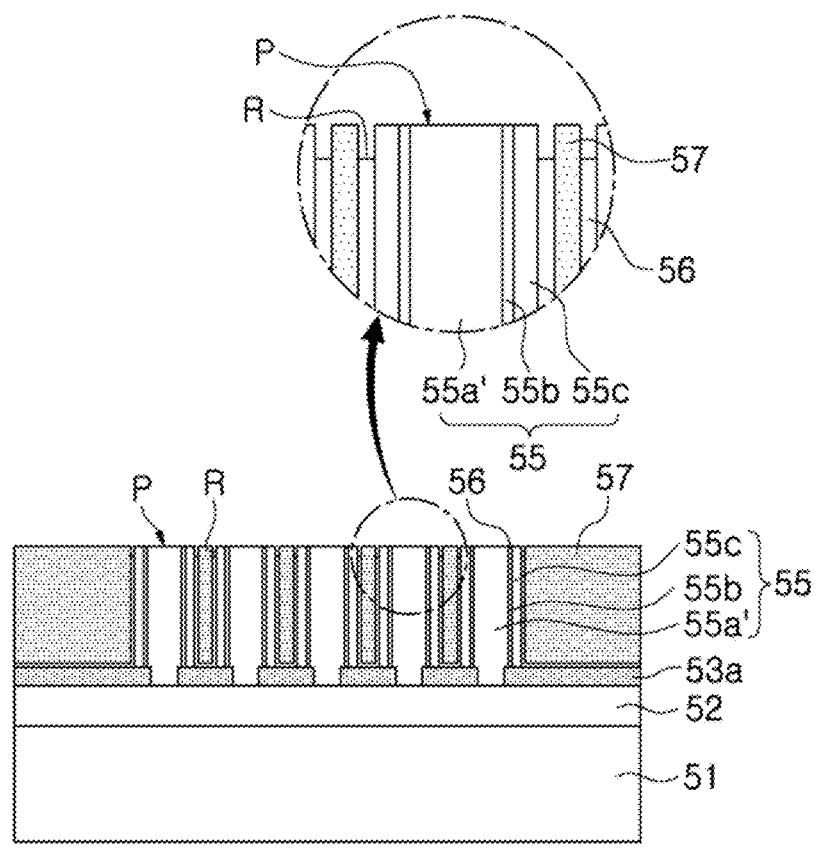

Thus, as described above, even in the case in which the active layer 55b is grown on the surfaces of the nanocore 55a' through the same process, a composition (in particular, the content of indium) of the active layer 55b may be different according to respective crystal planes. Also, the active layer portion formed in the upper part may be relatively thin. Thus, in order to address this problem, a process of removing the active layer formed on the upper part of the nanocore 55a' may be additionally undertaken as illustrated in FIGS. 20 through 22.

Figure 20:
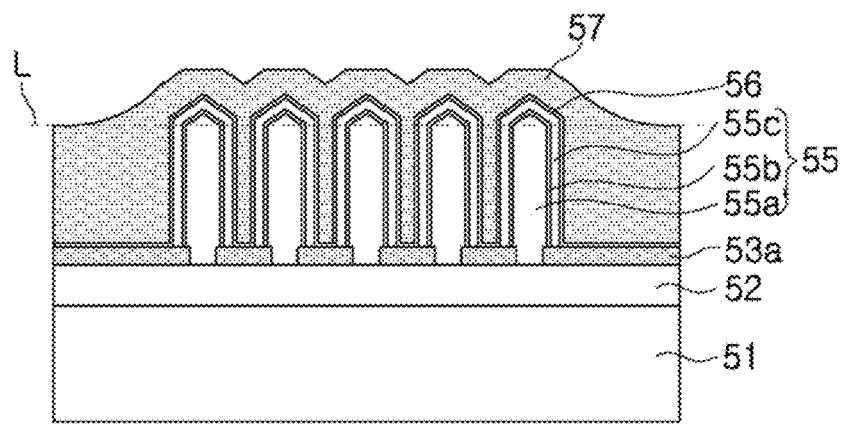

First, as illustrated in FIG. 20, a contact electrode 56 is formed on the light emitting nanostructures 55. Additionally, a protective insulating layer 57 may be formed on the contact electrode 56. The protective insulating layer 57 may be formed to fill spaces between the light emitting nanostructures 55.

The contact electrode 56 may be formed of a material forming ohmic-contact with the second conductivity-type semiconductor layer 55c. The protective insulating layer 57 may be formed of an electrically insulating material able to provide a passivation structure through a semiconductor process. A protective insulating layer formed of $SiO_2$ or $SiN_x$ may be used as the protective insulating layer 57.

Then, a process of performing planarizing to a level L so as to remove a portion of the active layer formed on the upper surface of the nanocore 55a' may be performed. As a result, as illustrated in FIG. 21, the portion of the active layer positioned on the other crystal plane (upper surface) of the nanocore 55a' may be removed, and the remaining active layer 55b may only be positioned on the side surfaces of nanocore 55a'. Since the side surfaces of the nanocore 55a' have same crystal planes, the remaining active layer 55b may allow desired wavelength characteristics to be obtained. A leakage current problem readily arising in the active layer portion positioned in the upper part of the nanocore 55' may be reduced.

Thereafter, as illustrated in FIG. 22, an upper portion of the contact electrode 56 may be selectively etched.

During the etching process, the contact electrode 56 may have a recess R positioned to be lower than the planarized upper surfaces P of the light emitting nanostructures 55. Thus, a leakage current problem may arise due to a material of the contact electrode 56 that may remain on the planarized surface through the previous polishing process or due to the contact electrode 26 positioned in the upper part during a subsequent process. Such a leakage current problem due to the contact electrode may be reduced by the present etching process.

The present etching process may be performed as a dry or wet etching process to selectively remove the contact electrode 56, and here, an appropriate etching process and an etchant may be selectively used depending on a material of the contact electrode 56. For example, in a case in which the contact electrode 56 is ITO and the light emitting nanostructures 55 is a nitride single crystal, a plasma etching process may be used, and here, $Cl_2$, $BCl_3$, Ar, or any combinations thereof may be used as a plasma gas. Also, selection (type or mixing ratio) of the etchant and process conditions may be adjusted.

The above-mentioned present embodiment provides the case in which the mask on the base layer employed in the aforementioned embodiment is configured of two material layers, but the embodiment is not limited thereto. That is, three or more material layers may be employed.

For example, in the case of a mask including first to third material layers sequentially formed on the base layer, the second material layer may be provided as an etch-stop layer and may be formed of a material different from those of the first and third material layers. The first and third material layers may be formed of the same material as needed.

Under the etching conditions of the third material layer, since at least the second material layer has an etching rate lower than that of the third material layer, the second material layer may serve as an etch-stop layer. At least the first material layer may be formed of a material having electrical insulation properties, and the second or third material layer or may be formed of an insulating material as necessary.

It is described that the heat treatment process introduced in the aforementioned embodiment is performed after the mask 53 is removed. However, the heat treatment process may also be applied before the mask 53 is removed after the completion of the growth of the nanocores to contribute to improvement of the crystallinity of the light emitting nanocores, further, the light emitting nanostructures. The heat treatment process introduced before the removal of the mask may be performed under conditions similar to the growth temperature, and may obtain a sufficient effect even with a period of time shorter than the heat treatment process performed before the removal of the mask. The heat treatment process performed before the removal of the mask may be understood as improving crystallinity of the nanocores in terms of rearrangement of crystal. This will be described in detail with reference to the embodiment hereinafter.

In the aforementioned embodiment, it is illustrated that side surfaces of the light emitting nanostructures are substantially perpendicular to the surface of the base layer, but the side surfaces thereof may also have a predetermined tilt angle.

The light emitting nanostructures having sloped side surfaces may be manufactured in various manners. For example, in a method using a mask as a mold structure, openings of the mask may have a shape providing an appropriate sloped surface. Nanocores having sloped side surfaces may be provided.

Figure 25:
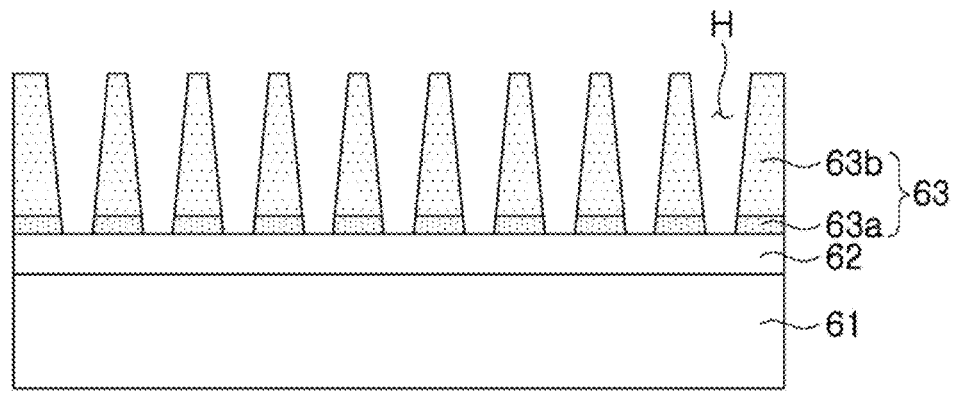
FIGS. 25 and 26 are side sectional views illustrating shapes of openings that may be formed in a mask employed in an embodiment of the present inventive concept.
Figure 26:
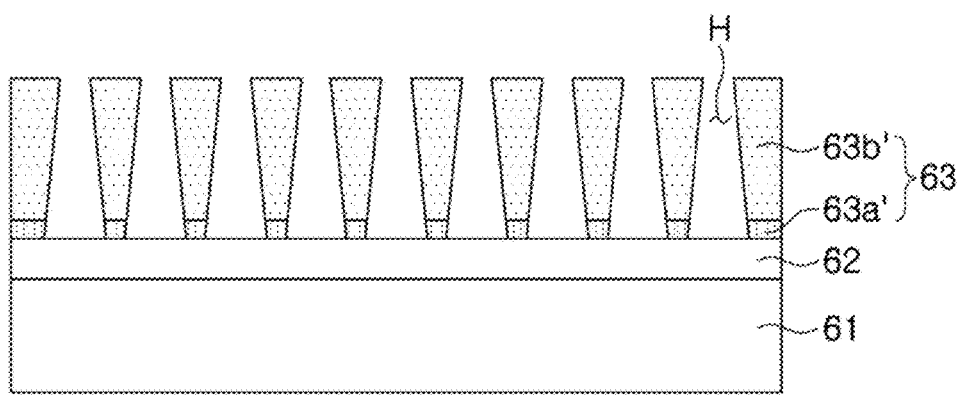
Figure 27:
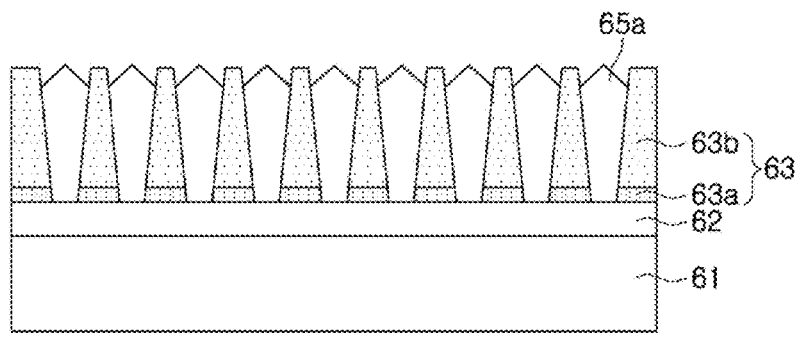
FIGS. 27 through 30 are cross-sectional views illustrating sequential processes in obtaining nanocores using the mask illustrated in FIG. 25.

In detail, FIGS. 25 and 26 illustrate masks having different shapes. In FIG. 25, a mask 63 including first and second material layers 63a and 63b may have openings H having a columnar structure having a cross-sectional area decreased in a direction toward an upper portion thereof. In FIG. 26, a mask 63', including first and second material layers 63a' and 63b', may have openings H having a columnar structure having a cross-sectional area increased in a direction toward an upper portion thereof.

In general, when openings having a high aspect ratio are formed, the openings obtained during a deep etching process may have a shape narrowed downwardly. Of course, the openings are not limited to such structures, and openings having various shapes having non-uniform widths in a thickness direction in an etching process may be used.

FIGS. 27 through 30 are cross-sectional views illustrating sequential processes in forming light emitting nanostructures using the mask 63 illustrated in FIG. 25;

As illustrated in FIG. 27A, nanocores 65a may be grown on a base layer 62 using the mask 63. The mask 63 has openings having a width decreased toward a lower portion thereof. The nanocores 65a may be grown to have shapes corresponding to those of the openings.

In order to further enhance crystal quality of the nanocores 65a, a heat treatment process may be performed one or more times during the growth of the nanocores 65a. In particular, a surface of an upper part of each nanocore 65a may be rearranged to have a hexagonal pyramidal crystal plane, thus obtaining a stable crystal structure and guaranteeing high quality in a crystal grown in a follow-up process.

The heat treatment process may be performed under the temperature conditions as described above. For example, for process convenience, the heat treatment process may be performed at a temperature equal or similar to the growth temperature of the nanocores 65a. Also, the heat treatment process may be performed in a manner of stopping a metal source such as TMGa, while maintaining pressure and a temperature equal or similar to the growth pressure and temperature of the nanocores 65a. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 65a may prevent degeneration of crystallinity caused when the nanocores 65a are grown at a fast speed, and thus, rapid crystal growth and excellent crystal quality may be promoted.

A time of a heat treatment process section and the number of heat treatment processes for stabilization may be variously modified according to a height and diameter of final nanocores. For example, in a case in which a width of each opening ranges from 300 nm to 400 nm and a height of each opening (thickness of the mask) is approximately 2.0 µm, a stabilization time duration ranging from approximately 10 seconds to 60 seconds may be inserted in a middle point, i.e., approximately 1.0 µm to grow cores having desired high quality. The stabilization process may be omitted according to core growth conditions.

Figure 28:
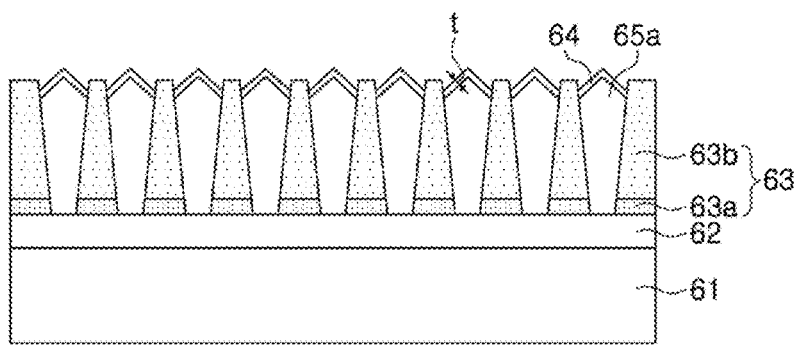

Subsequently, as illustrated in FIG. 28, a current suppressing intermediate layer 64, a highly resistive layer, may be formed on the upper part of the nanocores 65a.

After the nanocores 65a are formed to have a desired height, the current suppressing intermediate layer 64 may be formed on the surfaces of the upper parts of the nanocores 65a with the mask 63 retained as is. Thus, since the mask 63 is used as is, the current suppressing intermediate layer 64 may be easily formed in the desired regions (the surface of the upper parts) of the nanocores 65a without forming an additional mask.

The current suppressing intermediate layer 64 may be a semiconductor layer not doped on purpose or may be a semiconductor layer doped with a second conductivity-type impurity opposite to that of the nanocores 65a. For example, in a case in which the nanocores 65a are n-type GaN, the current suppressing intermediate layer 64 may be undoped GaN or GaN doped with magnesium (Mg) as a p-type impurity. In this case, by changing types of an impurity during the same growth process, the nanocores 65a and the current suppressing intermediate layer 64 may be continuously formed. For example, in case of stopping silicon (Si) doping and injecting magnesium (Mg) and growing the same for approximately 1 minute under the same conditions as those of the growth of the n-type GaN nanocores, the current suppressing intermediate layer 64 having a thickness ranging from approximately 200 nm to 300 nm may be formed, and such a current suppressing intermediate layer 64 may effectively block a leakage current of a few µA or more. In this manner, the current suppressing intermediate layer may be simply formed during the mold-type process as in the present embodiment.

Figure 29:
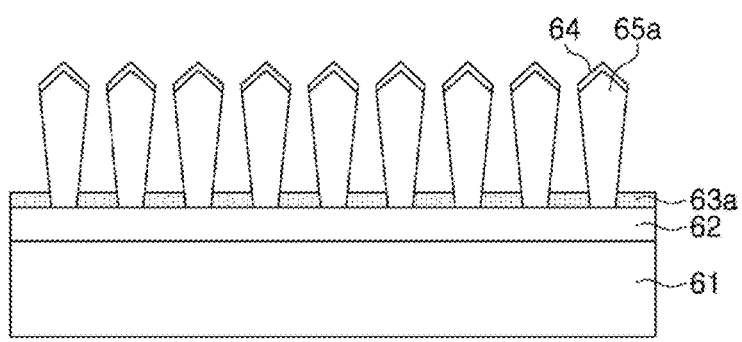
Figure 30:
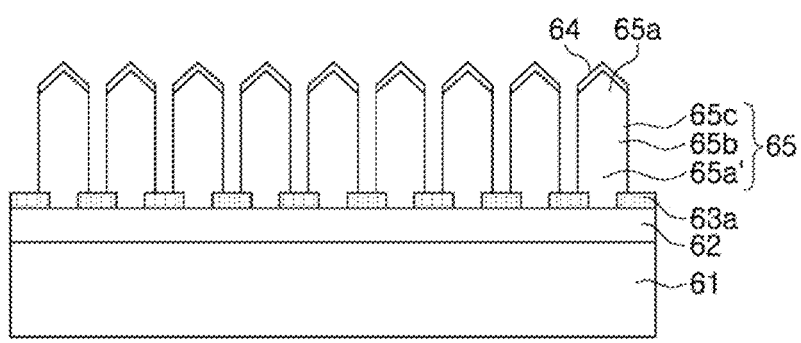

Subsequently, as illustrated in FIG. 29, portions of the mask layer 63 to reach the first material layer 63a as an etch-stop layer are removed to expose lateral surfaces of the plurality of nanocores 65a.

In the present embodiment, by applying the etching process of selectively removing the second material layer 63b, only the second material layer 63b may be removed, while the first material layer 63a may be retained. The residual first material layer 63a may serve to prevent the active layer and the second conductivity-type semiconductor layer from being connected to the base layer 62 in a follow-up growth process.

In the present embodiment, an additional heat treatment process may be introduced during the process of forming the light emitting nanostructures using the mask having openings as a mold in order to enhance crystallinity.

After the second material layer 63b of the mask is removed, the surfaces of the nanocores 65a may be heat-treated under predetermined conditions to change unstable crystal planes of the nanocores 65a into stable crystal planes (please refer to FIGS. 23 and 24). In particular, in the present embodiment, the nanocores 65a are grown on the openings having sloped side walls to have the sloped side walls corresponding to the shape of the openings. However, after the heat treatment process is performed, crystals are rearranged and regrown so the nanocores 65a' may have a substantially uniform diameter (or width). Also, the upper parts of the nanocores 65a may have an incomplete hexagonal pyramidal shape immediately after being grown, but the nanocores 65a' after the heat treatment process may have a hexagonal pyramidal shape having uniform surfaces. In this manner, the nanocores having a non-uniform width after the removal of the mask may be regrown (and rearranged) to have a hexagonal pyramidal columnar structure having a uniform width through the heat treatment process.

Hereinafter, the results of the regrowth (rearrangement) of the nanocores based on the heat treatment process as described above will be described through specific Experimental Example.

EXPERIMENTAL EXAMPLE

Heat Treatment Process

Figure 31:
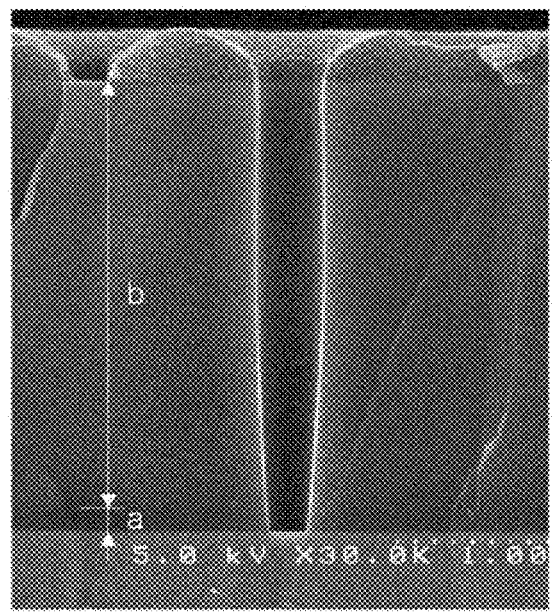
FIG. 31 is a scanning electron microscope (SEM) photograph obtained by imaging a mask employed in an experimental example.

Two layers of SiN/SiO$_2$ were formed on an n-type GaN base layer and openings were formed. Here, the SiN layer ("a" in FIG. 9) was formed to have a thickness of approximately 100 nm and the SiO$_2$ layer ("b" in FIG. 9) was formed to have a thickness of 2500 nm. Openings of the mask were formed by performing etching with a plasma obtained by combining C$_4$F$_8$, O$_2$ and, Ar for approximately 5 minutes through a photoresist (layer positioned on "b" in FIG. 9) process. FIG. 31 is a scanning electron microscope (SEM) photograph obtained by imaging a cross-section of an opening obtained through the process. As illustrated in FIG. 31, the opening in the mask has a width decreased toward a lower portion thereof.

Nanocores were grown on the openings of the mask using an MOCVD process. Here, TMGa and NH$_3$ were used as source gases, and nanocores were grown for approximately minutes, while the temperature of a substrate was maintained at approximately 1100° C.

In order to enhance crystal quality of the nanocores, a stabilization process (heat treatment process) was additionally performed during the growth of the nanocores. Namely, when the nanocores 35a were grown to reach a height of approximately 1.0 µm, a desired intermediate point (approximately 10 minutes) of the nanocores, supply of a TMGa source was stopped and a heat treatment was performed at a temperature (approximately 1100° C.) similar to that of the substrate during the growth for approximately 30 seconds to 50 seconds under an NH$_3$ atmosphere.

Figure 32:
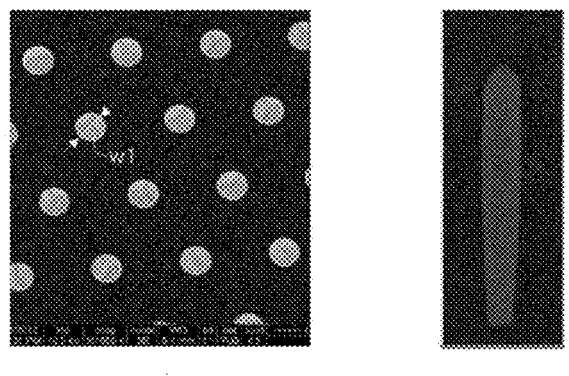
FIGS. 32(a) and 32(b) are SEM photographs obtained by imaging a planar arrangement of nanocores and a lateral cross-sectional structure grown using a mask employed in an experimental example.

After the growth of the desired nanocores was completed, an oxide film portion of the mask was removed. The nanocores corresponding to the shape of the openings appeared to have a cylindrical shape having sloped side walls (please refer to FIG. 32). The nanocores having the cylindrical structure were determined to have a height of approximately 2467 nm and a diameter of approximately 350 nm.

After the mask was removed, a heat treatment process was applied. Namely, the heat treatment process was performed at a substrate temperature of approximately 1100° C. (1000° C. to 1200° C.) for approximately 20 minutes (15 minutes to 25 minutes).

Figure 33:
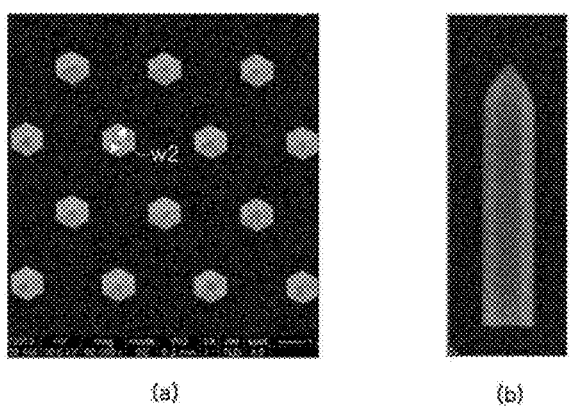
FIGS. 33(a) and 33(b) are SEM photographs obtained by imaging a planar arrangement of nanocores and a lateral cross-sectional structure heat-treated in an experimental example.

After the heat treatment process, crystals of the nanocores were regrown and rearranged, and it was confirmed that the diameter which was not uniform in the height direction was changed into a substantially uniform diameter and the incomplete hexagonal pyramidal shape of the upper parts of the nanocores was changed into a hexagonal pyramidal shape having uniform surfaces after the heat treatment process (please refer to FIG. 33).

In detail, a diameter w1 of each nanocore before the heat treatment process was 350 nm, but after the heat treatment process, the width (w2: interfacial interval of the hexagon) was approximately 410 nm, approximately 60 nm or greater. Also, it was confirmed that, while a degree of increase is smaller, a height of each nanocore was changed from 2467 nm to 2470 nm, exhibiting an increase of approximately 3 nm.

As in the Experimental Example, it was confirmed that the nanocores having an uneven width after the removal of the mask was regrown (and rearranged) to have the hexagonal pyramidal columnar structure having a uniform width through the heat treatment process.

During the foregoing heat treatment process, a size and a shape of the nanocores after the regrowth may be relatively changed depending on a heat treatment process temperature (namely, a substrate temperature) and a heat treatment process time, whether or not a source gas is supplied, or an amount of supplied source gas. For example, heat treatment may be performed at a temperature of 1000° C. or higher for 5 or more minutes in a state in which supply of a source gas is stopped, crystals may be rearranged on the surface of the nanocores, reducing a change in size of nanocores due to an etching effect (namely, N evaporation). The change in the diameter of the nanocores may be maintained at a level of 10% or less in consideration of a process time, condition, and cost. As described above, uniformity of the diameter (or width) of the nanocores may be maintained at 95% or more. In this case, the diameter of each nanocore grown in a group in which sizes of openings of the mask are equal may be substantially equal.

The above-described embodiment exemplifies a method of manufacturing a nanostructure semiconductor light emitting device, for growing nanocores by using a mask having openings, as a mold. However, the method according to the above-described embodiment may be modified or improved in various embodiments.

At least a portion of nanocores among the plurality of nanocores may be designed such that at least one of cross-sectional areas (or diameters) and intervals between the at least a portion of nanocores are different from those of remaining nanocores.

By designing any one of the cross-sectional areas (or diameters) of the light emitting structures and intervals therebetween to be differentiated, even when the same active layer formation process is applied thereto, a plurality of different wavelengths of light may be emitted. As described above, since a plurality of different wavelengths of light are emitted by differentiating the design of nanostructures, white light may be obtained in a single device. FIGS. 34 through 40 are cross-sectional views illustrating respective main processes in a method of manufacturing a white nanostructure semiconductor light emitting device according to another embodiment of the present inventive concept (a polishing process introduction).

Figure 34:
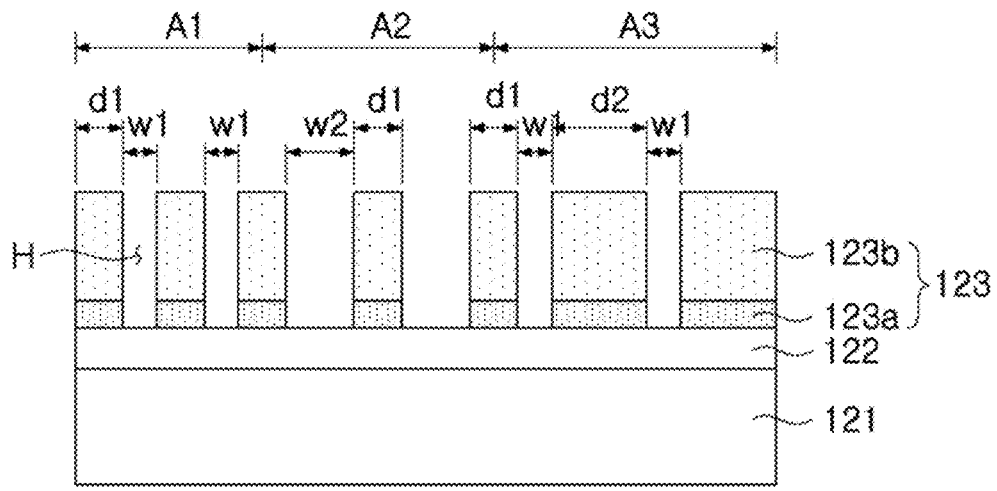
FIGS. 34 through 40 are cross-sectional views illustrating main processes in a method of manufacturing a nanostructure semiconductor light emitting device according to an embodiment of the present inventive concept.

First, as shown in FIG. 34, a mask 123 having a plurality of openings H and an etch-stop layer interposed therein is formed on a base layer 122 formed on a substrate 121.

The mask 123 according to the present embodiment may include a first material layer 123a formed on the base layer 122, and a second material layer 123b formed on the first material layer 123a and having an etching rate greater than that of the first material layer 123a.

The openings H may be formed to have different patterns. In detail, in the present embodiment, three different groups of openings may be formed. Openings of a second group A2 have an interval d1 therebetween the same as an interval d2 between openings of a first group A1, and may have a width w2 greater than a width w1 of the openings of the first group A1. An openings of a third group A3 may have a width w1 the same as the width w1 of the openings of the first group A1, and the openings of the third group A3 may have an interval d2 therebetween greater than the interval d1 between the openings of the first group A1.

Substantially, the increase in an interval between the openings indicates a relative increase in a contact amount of source gas with regard to the same area, and thus, a growth speed of nanocores 125a may be relatively rapid. The increase in a width of the opening indicates a relative reduction in the contact amount of source gas in the same area, and thus, the growth speed of the nanocores 125a may be relatively slow.

In this embodiment, the configuration in which the interval d between the openings and the width w of the openings are differentiated is illustrated, but two or more groups may also be formed by differentiating only any one of the interval d between the openings and the width w of the openings. For example, when two or more groups having different intervals d between openings are formed, the width w of the openings may be the same, while when two or more groups having different widths of openings are formed, the intervals d between the openings may be uniform.

Here, light emitted from the two or more groups may complement each other, or the two or more groups may be configured to emit white light when combined. For example, in the case of two groups, the two groups may be desired such that when one group emits blue light, the other group emits yellow light. In the case of three groups, any one of the intervals d between the openings and the widths w of the openings may be differentially designed to emit blue, green, and red light, respectively.

As the interval d between the openings increases, wavelength of light increases, and thus, an active layer emitting blue light may be obtained from a group in which the interval d between openings is relatively small, and an active layer emitting red light may be obtained from a group in which the interval d between openings is relatively large. As the interval d between the openings increases, thicknesses (lateral direction with respect to the core) of the active layer and/or the second conductivity-type semiconductor layer tend to increase. Thus, in general, a diameter of light emitting nanostructure (a nanocore, an active layer, and a second conductivity-type semiconductor layer) emitting red light may be greater than those of light emitting nanostructures emitting blue and green light, and the diameter of the light emitting nanostructure emitting green light may be greater than that of the light emitting nanostructure emitting green light.

Figure 35:
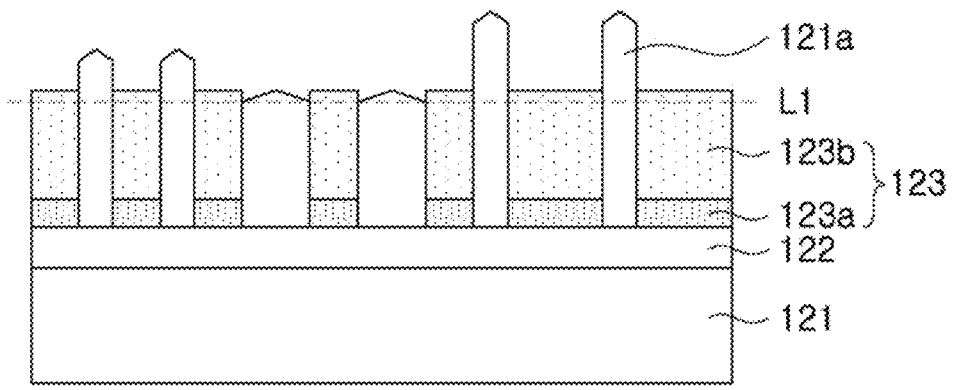

As described above, the nanocores 125a may have different heights for respective groups, for example, three groups, due to the difference in a growth speed of the nanocores 125a between the width of the opening and the interval between the openings as shown in FIG. 35. In order to improve the non-uniform height, planarization to form an appropriate level L1 may be performed in the present process as shown in FIG. 36, thereby achieving a uniform height of the nanocores 125a per respective group.

Since the mask 123 is used as a structure supporting the nanocores 125a during the planarization process as described above, the planarization process may be easily performed without damage to the nanocores 125a. The planarization process may be performed after a core-shell structure and a contact electrode are formed, and in this case, the planarization process may be omitted in this process according to device structures.

Figure 36:
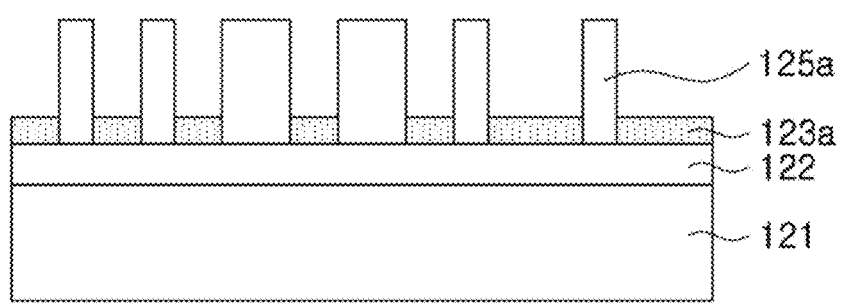

As illustrated in FIG. 36, the mask 123 may be partially removed using the etch-stop layer to expose side surfaces of the planarized nanocores 125a. That is, in the present process, the second material layer 123b may only be removed and the first material layer 123a may remain.

Figure 37:
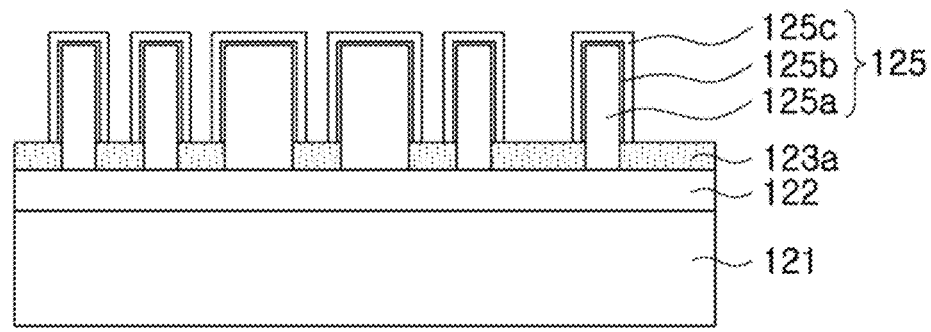

Subsequently, an active layer 125b and a second conductivity-type semiconductor layer 125c may be sequentially grown on the surfaces of the plurality of nanocores 125a as illustrated in FIG. 37.

Through the above-mentioned process, the light emitting nanostructure 125 may have a core-shell structure in which the first conductivity-type semiconductor is provided as the nanocores 125a, and the active layer 125b and the second conductivity-type semiconductor layer 125c surrounding the nanocore 125a are provided as shell layers.

Figure 38:
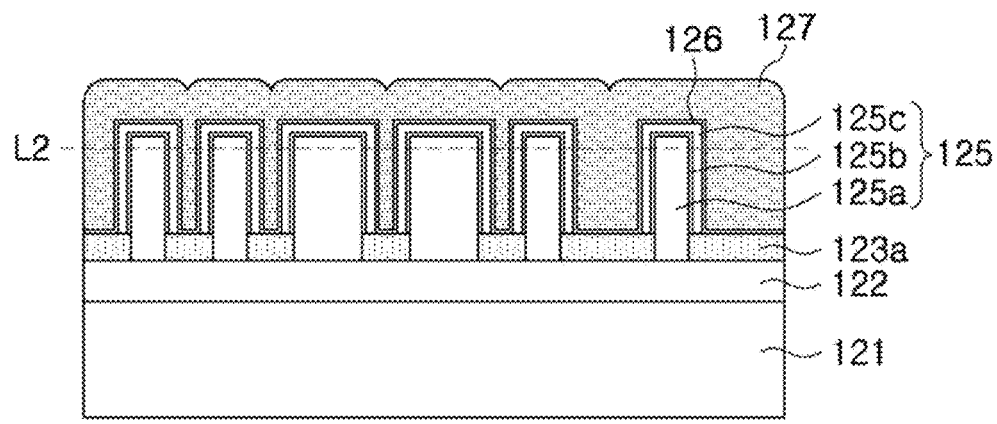

As illustrated in FIG. 38, a contact electrode 126 is formed on the light emitting nanostructures 125, and an protective insulating layer 127 may additionally be formed on the contact electrode 126.

The protective insulating layer 127 may be formed to fill spaces between the light emitting nanostructures 125. The protective insulating layer 127 may be formed of an electrically insulating material able to provide a passivation structure through a semiconductor process. In detail, the protective insulating layer 127 may be formed of TEOS, BPSG, CVD-SiO$_2$, SOG, or a SOD material in order to easily fill the spaces between the light emitting nanostructures 125.

Then, a process of performing planarizing to a level L2 so as to remove a portion of the active layer formed on the other crystal plane (upper surface) of the nanocore 125*a* may be performed. As a result, as illustrated in FIG. 12F, the portion of the active layer formed on the other crystal plane (upper surface) of the nanocore 125*a* may be removed, and the remaining portions of the active layer 125*b* may be formed only on the side surfaces of nanocore 125*a*. Since the side surfaces of the nanocore 125*a* have the same crystal planes, the remaining portions of the active layer 125*b* may accurately exhibit desired wavelength characteristics. A leakage current problem easily arising in the active layer portion positioned in the upper part of the nanocores 125*a* may be reduced.

Figure 39:
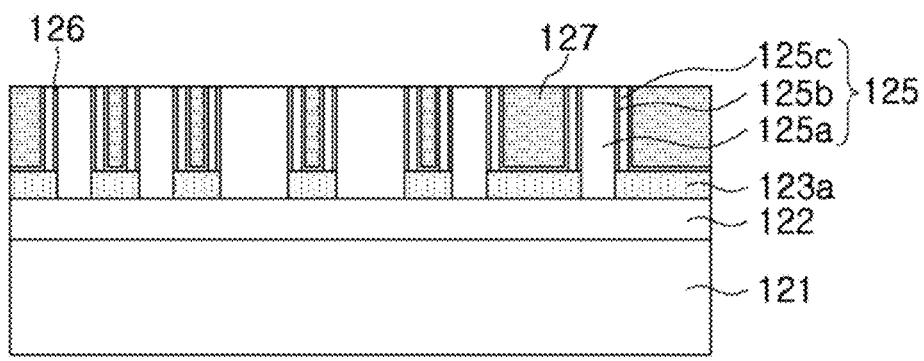
Figure 40:
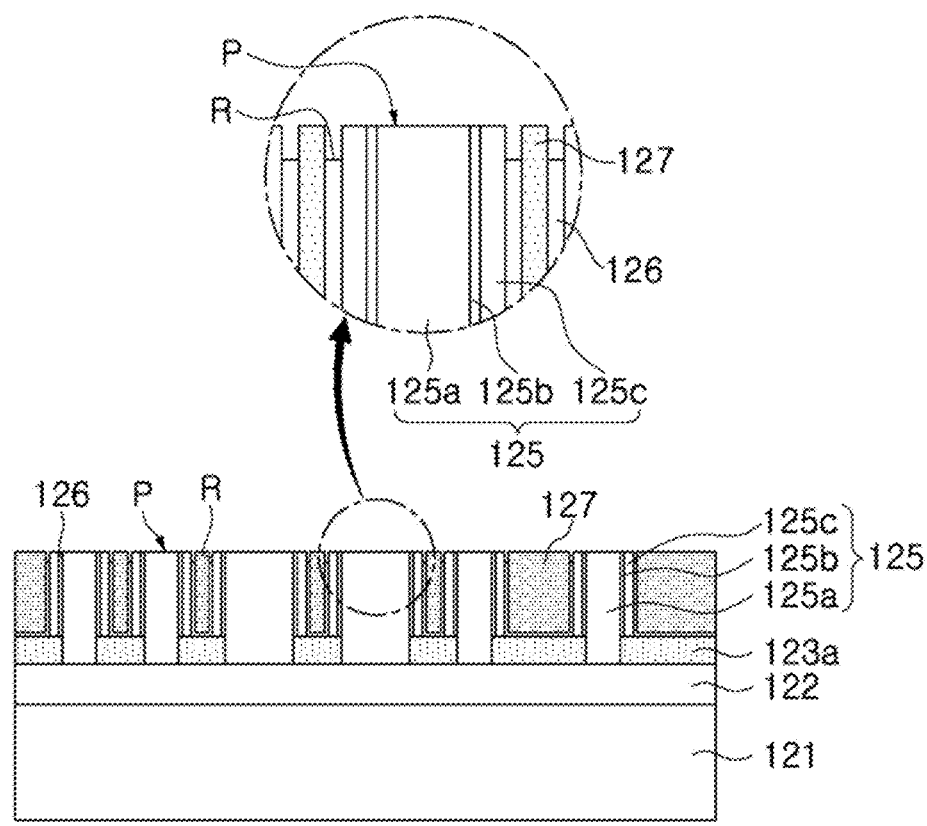

Thereafter, as illustrated in FIG. 39, an upper portion of the contact electrode 126 may be selectively etched.

During the etching process, the contact electrode 126 may have a recess R positioned to be lower than the planarized upper surfaces P of the light emitting nanostructures 125. Thus, a leakage current problem that may arise due to material of the contact electrode 126 that may remain on the planarized surface or due to the contact electrode 126 positioned in the upper part during a subsequent process may be reduced.

The present etching process may be performed as dry or wet etching process to selectively remove the contact electrode 126, and here, an appropriate etching process and an etchant may be selectively used depending on a material of the contact electrode 126. For example, in a case in which the contact electrode 126 is ITO and the light emitting nanostructures 125 is a nitride single crystal, a plasma etching process may be used, and here, Cl$_2$, BCl$_3$, Ar, or any combinations thereof may be used as a plasma gas. Also, selection (type or mixing ratio) of the etchant and process conditions may be adjusted.

In this embodiment, an example in which the planarization process is performed twice is described, but the first planarization process (FIGS. 35 and 36) may be omitted and only the second planarization process (FIGS. 38 and 39) may be performed. In this case, through the second planarization process, the active layer portion positioned in the upper part of the nanocores 125*a* may be removed and heights of light emitting nanostructures of other groups may be uniformly controlled.

Figure 41:
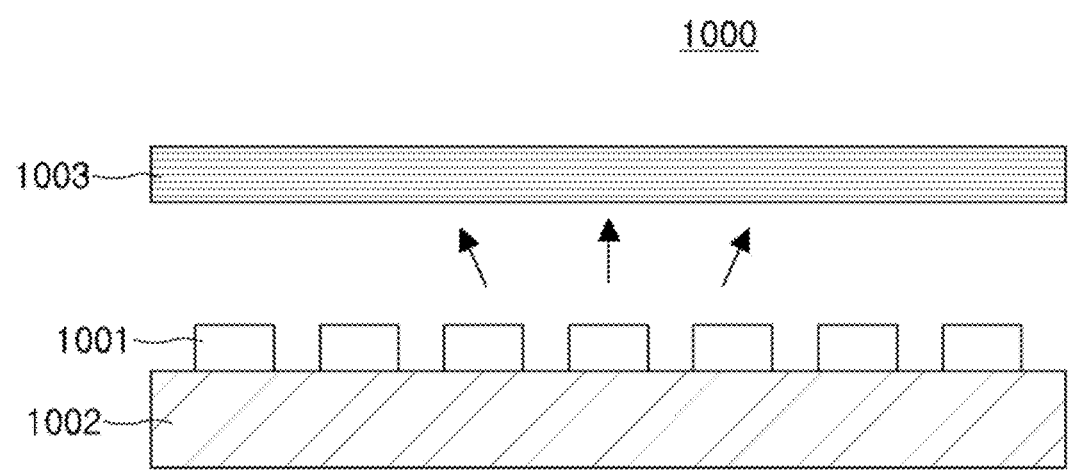
FIGS. 41 and 42 are views illustrating a backlight unit employing a semiconductor light emitting device according to an embodiment of the present inventive concept.
Figure 42:
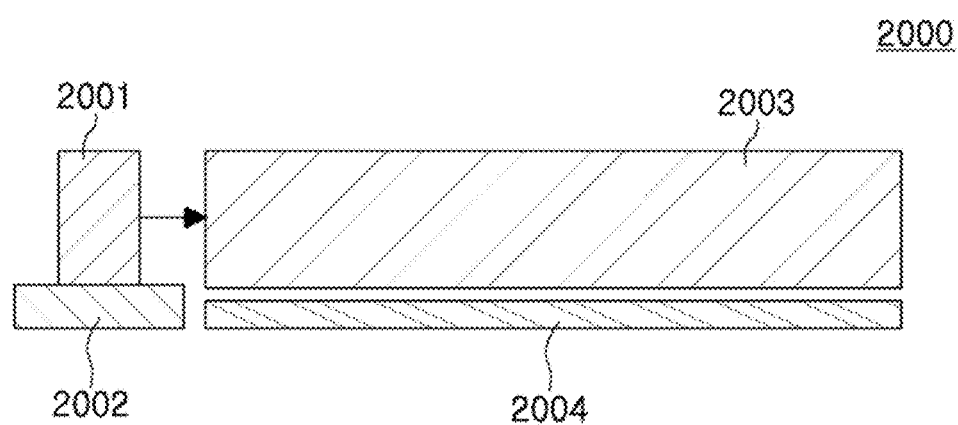

FIGS. 41 and 42 are views illustrating a backlight unit employing a semiconductor light emitting device according to an embodiment of the present inventive concept.

Referring to FIG. 41, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 41 in which the light sources 1001 emit light toward an upper side on which a liquid crystal display is disposed, a backlight unit 2000 as another example illustrated in FIG. 42 is configured such that light sources 2001 mounted on a board 2002 emit light in a lateral direction, and the emitted light may be incident to a light guide plate 2003 so as to be converted into a surface light source. Light, passing through the light guide plate 2003, is emitted upwardly, and in order to enhance light extraction efficiency, a reflective layer 2004 may be disposed on a lower surface of the light guide plate 2003.

Figure 43:
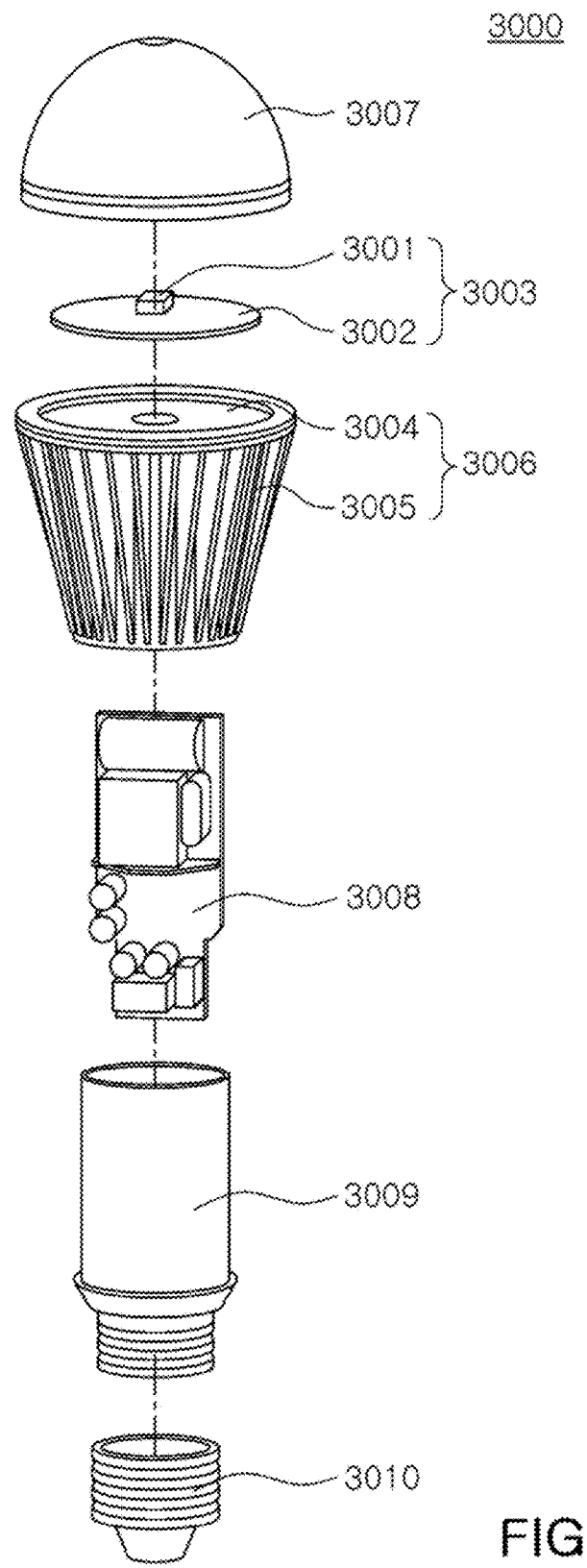
FIG. 43 is a view illustrating an example of a lighting device employing a semiconductor light emitting device according to an embodiment of the present inventive concept.

FIG. 43 is a view illustrating an example of a lighting device employing a semiconductor light emitting device according to an embodiment of the present inventive concept.

A lighting device 3000 is illustrated, for example, as a bulb-type lamp in FIG. 43, and includes a light emitting module 3003, a driving unit 3008, and an external connection unit 3010.

Also, the lighting device 3000 may further include external structures such as external and internal housings 3006 and 3009 and a cover unit 3007. The light emitting module 3003 may include a light source 3001 having the aforementioned semiconductor light emitting device package structure or a structure similar thereto and a circuit board 3002 with the light source 3001 mounted thereon. For example, the first and second electrodes of the aforementioned semiconductor light emitting device may be electrically connected to an electrode pattern of the circuit board 3002. In the present embodiment, it is illustrated that a single light source 3001 is mounted on the circuit board 3002, but a plurality of light sources may also be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the side surfaces of the lighting device 3000. Also, the cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and provide the same. For example, the driving unit 3008 may be configured as an AC-DC converter or a rectifying circuit component.

Figure 44:
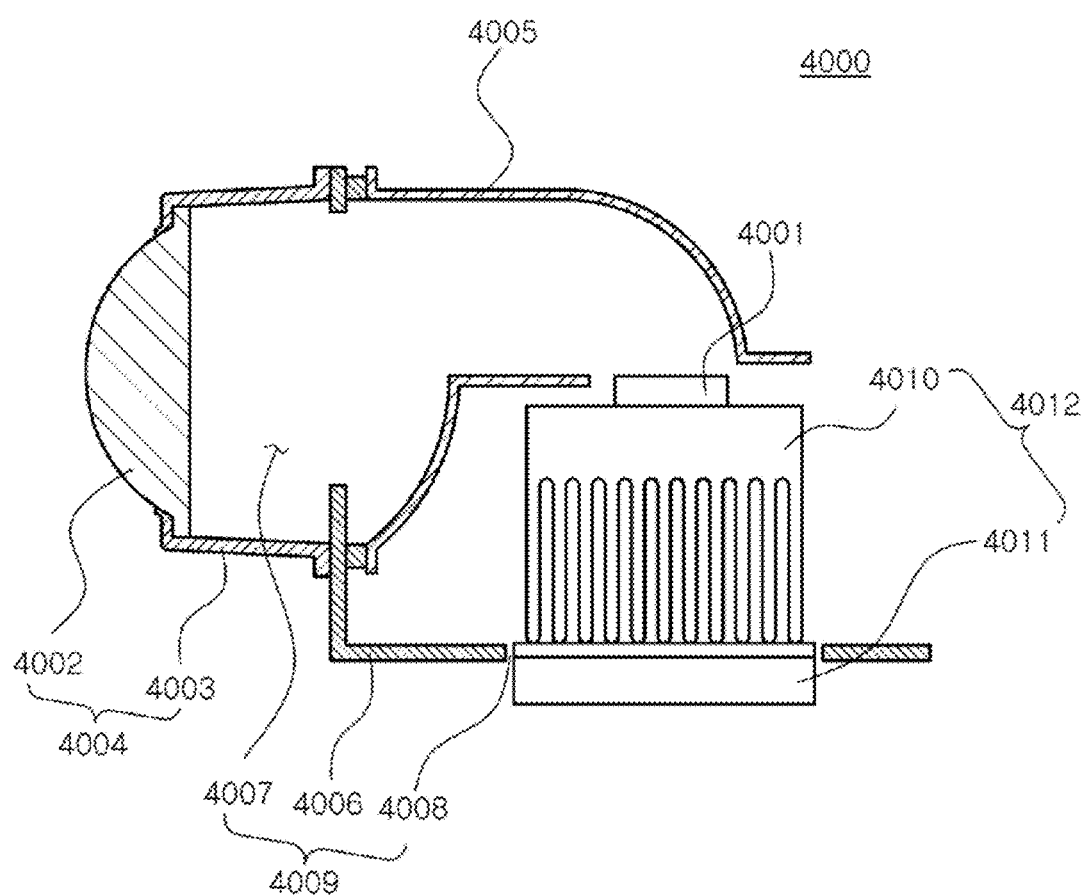
FIG. 44 is a view illustrating an example of a headlamp employing a semiconductor light emitting device according to an embodiment of the present inventive concept.

FIG. 44 is a view illustrating an example of a headlamp employing a semiconductor light emitting device according to an embodiment of the present inventive concept.

Referring to FIG. 44, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting device or a package including the semiconductor light emitting device.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may have a central hole 4008 formed in one surface thereof, in which the heat dissipation unit 4012 is coupled.

The housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is open by the reflective unit 4005, and the reflective unit 4005 is fixed to the housing 4009 such that the open front side corresponds to the front hole 4007, and light reflected by the reflective unit 4005 may pass through the front hole 4007 so as to be output outwardly.

While the present invention has been shown and described in connection with the embodiments, it will be apparent to those skilled in the art that modifications and variations can be made without departing from the spirit and scope of the present inventive concept as defined by the appended claims.

The invention claimed is:

1. A method for manufacturing a nanostructure semiconductor light emitting device, the method comprising:
   forming a mask having a plurality of openings on a base layer;
   growing a first conductivity-type semiconductor layer on exposed regions of the base layer such that the plurality of openings are filled, to form a plurality of nanocores;
   partially removing the mask such that side surfaces of the plurality of nanocores are exposed;
   sequentially growing an active layer and a second conductivity-type semiconductor layer on surfaces of the plurality of nanocores to form a plurality of light emitting nanostructures;
   forming a contact electrode on surfaces of the plurality of light emitting nanostructures, the contact electrode forming ohmic-contact with the second conductivity-type semiconductor layer;
   planarizing upper parts of the plurality of light emitting nanostructures such that upper surfaces of the nanocores are exposed; and
   partially removing the contact electrode such that the contact electrode has a height lower than upper surfaces of the light emitting nanostructures.

2. The method of claim 1, further comprising heat-treating the plurality of nanocores, between the partially removing of the mask and the sequentially growing of the active layer and the second conductivity-type semiconductor layer.

3. The method of claim 2, wherein the heat treatment is performed in a temperature range from 600° C. to 1200° C.

4. The method of claim 1, wherein the plurality of nanocores have a substantially cylindrical shape before the heat treatment, and the shape of the plurality of nanocores are converted into a substantial hexagonal prismatic shape through the heat treatment.

5. The method of claim 1, wherein the forming of the plurality of nanocores comprises a crystal stabilization operation of performing a heat treatment after temporarily halting growth of the first conductivity-type semiconductor layer during growth of the first conductivity-type semiconductor layer.

6. The method of claim 1, further comprising forming an insulating layer to fill spaces between the plurality of light emitting nanostructures, after the forming of the contact electrode and prior to the planarizing.

7. The method of claim 1, wherein side surfaces of the plurality of nanocores have crystal planes perpendicular to an upper surface of the base layer.

8. The method of claim 7, wherein the plurality of light emitting nanostructures and the base layer are a nitride single crystal, and the side surfaces of the plurality of nanocores are non-polar surfaces.

9. The method of claim 1, wherein the mask comprises a first material layer positioned on the base layer and a second material layer positioned on the first material layer and having an etching rate greater than that of the first material layer, and the partially removing the mask comprises removing the second material layer such that the first material layer remains.

10. The method of claim 1, wherein the plurality of openings are classified as belonging to two or more groups different from each other in terms of at least one of a diameter of the plurality of openings and an interval between the plurality of openings, openings of the different groups have substantially the same diameter and interval therebetween, light emitting nanostructures positioned in openings of the different groups emit light having different wavelengths, and light emitting nanostructures positioned in openings of the same group emit light having substantially the same wavelength.

11. The method of claim 10, wherein light of different wavelengths emitted from light emitting nanostructures positioned in the openings of the different groups are combined to form white light.

12. The method of claim 1, further comprising: regrowing the plurality of nanocores by supplying a source gas for the first conductivity-type semiconductor, between the partially removing of the mask and the sequentially growing of the active layer and the second conductivity-type semiconductor layer.

13. A method for manufacturing a nanostructure semiconductor light emitting device, the method comprising:
   forming a mask having a plurality of openings on a base layer;
   growing a first conductivity-type semiconductor layer on exposed regions of the base layer such that the plurality of openings are filled, to form a plurality of nanocores;
   sequentially growing an active layer and a second conductivity-type semiconductor layer on surfaces of the plurality of nanocores to form a plurality of light emitting nanostructures;
   forming a contact electrode on surfaces of the plurality of light emitting nanostructures, the contact electrode forming ohmic-contact with the second conductivity-type semiconductor layer;
   planarizing upper parts of the plurality of light emitting nanostructures such that upper surfaces of the nanocores are exposed; and
   partially removing the contact electrode such that the contact electrode has a height lower than upper surfaces of the plurality of light emitting nanostructures.

14. The method of claim 13, further comprising: forming an insulating layer to fill spaces between the plurality of light emitting nanostructures, between the forming of the contact electrode and the planarizing.

15. A method for manufacturing a nanostructure semiconductor light emitting device, the method comprising:
   forming a mask having a plurality of openings on a base layer;
   growing a first conductivity-type semiconductor layer on exposed regions of the base layer such that the plurality of openings are filled, to form a plurality of nanocores;
   sequentially growing an active layer and a second conductivity-type semiconductor layer on surfaces of the plurality of nanocores to form a plurality of light emitting nanostructures;
   forming a contact electrode on surfaces of the plurality of light emitting nanostructures;
   planarizing upper parts of the plurality of light emitting nanostructures such that upper surfaces of the nanocores are exposed; and partially removing the contact electrode such that the contact electrode has a height lower than upper surfaces of the plurality of light emitting nanostructures, wherein the mask comprises a first material layer positioned on the base layer and a second material layer positioned on the first material layer and having an etching rate greater than that of the first material layer, and the method further comprising: removing the second material layer to expose side surfaces of the plurality of nanocores such that the first material layer remains, before the forming of the plurality of light emitting nanostructures.

* * * * *